US 11,204,388 B2

(12) United States Patent
Tabuchi et al.

(10) Patent No.: US 11,204,388 B2
(45) Date of Patent: Dec. 21, 2021

(54) POWER GENERATION EQUIPMENT MONITORING SYSTEM, POWER GENERATION EQUIPMENT MONITORING METHOD AND PROGRAM

(71) Applicant: Panasonic Intellectual Property Management Co., Ltd., Osaka (JP)

(72) Inventors: Shin Tabuchi, Kyoto (JP); Satoshi Kanai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 412 days.

(21) Appl. No.: 16/300,011

(22) PCT Filed: May 2, 2017

(86) PCT No.: PCT/JP2017/017222
§ 371 (c)(1),
(2) Date: Nov. 8, 2018

(87) PCT Pub. No.: WO2017/195698
PCT Pub. Date: Nov. 16, 2017

(65) Prior Publication Data
US 2019/0178942 A1    Jun. 13, 2019

(30) Foreign Application Priority Data

May 9, 2016    (JP) .............................. JP2016-094060

(51) Int. Cl.
*G01R 31/34*    (2020.01)
*F03D 17/00*    (2016.01)
(Continued)

(52) U.S. Cl.
CPC ......... *G01R 31/346* (2013.01); *G01R 31/343* (2013.01); *G06Q 50/06* (2013.01); *H02P 9/04* (2013.01); *F03D 17/00* (2016.05)

(58) Field of Classification Search
CPC .... G01R 31/34; G01R 31/343; G01R 31/346; G06Q 50/06; H02P 9/04; H02P 29/02
See application file for complete search history.

(56) References Cited

U.S. PATENT DOCUMENTS

| | | | |
|---|---|---|---|
| 2009/0193894 A1* | 8/2009 | Kabatzke | ............... G01P 3/48 |
| | | | 73/510 |
| 2010/0320763 A1* | 12/2010 | Li | ............................ H02P 6/16 |
| | | | 290/44 |

(Continued)

FOREIGN PATENT DOCUMENTS

| | | |
|---|---|---|
| JP | H05-196702 A | 8/1993 |
| JP | 2000-184658 A | 6/2000 |

(Continued)

OTHER PUBLICATIONS

International Search Report and Written Opinion issued in International Application No. PCT/JP2017/017222 dated Jul. 11, 2017.

*Primary Examiner* — Huy Q Phan
*Assistant Examiner* — David B Frederiksen
(74) *Attorney, Agent, or Firm* — McDermott Will & Emery LLP

(57) ABSTRACT

A power generation equipment monitoring system includes a receiver and a determining processor. The receiver acquires, from a measuring device that measures output currents of power generation equipment that converts rotational energy of a rotor thereof into electric energy to output AC voltage with a reference frequency, waveform data representing waveform of the output currents. The determining processor determines presence and absence of a malfunction in a rotary block that applies motive power to (Continued)

the rotor of the power generation equipment, according to the waveform data acquired through the receiver. The determining processor determines the presence and absence of the malfunction based on a component of at least one specific frequency arranged at one or more intervals according to a rotational speed of the rotor from the reference frequency on a frequency axis in a frequency spectrum of the output currents.

19 Claims, 7 Drawing Sheets

(51) Int. Cl.
*H02P 9/04* (2006.01)
*G06Q 50/06* (2012.01)

(56) References Cited

U.S. PATENT DOCUMENTS

| | | | | |
|---|---|---|---|---|
| 2011/0089694 | A1* | 4/2011 | Arinaga | F03D 7/0272 |
| | | | | 290/44 |
| 2013/0278282 | A1 | 10/2013 | Leppich et al. | |
| 2013/0307577 | A1* | 11/2013 | Falkenstein | G01R 31/34 |
| | | | | 324/765.01 |
| 2014/0062350 | A1* | 3/2014 | Han | H02P 21/10 |
| | | | | 318/139 |
| 2014/0074427 | A1 | 3/2014 | Ottewill et al. | |
| 2014/0184125 | A1* | 7/2014 | Fu | B60L 3/0061 |
| | | | | 318/490 |
| 2015/0176570 | A1* | 6/2015 | Egedal | F03D 7/0224 |
| | | | | 416/1 |
| 2015/0331051 | A1 | 11/2015 | Maki et al. | |
| 2016/0215764 | A1 | 7/2016 | Sakaguchi | |
| 2016/0266207 | A1* | 9/2016 | Liu | H02H 3/08 |
| 2016/0266208 | A1* | 9/2016 | Athikessavan | G01R 31/346 |
| 2016/0357207 | A1* | 12/2016 | Desabhatla | H02J 3/1885 |
| 2017/0176536 | A1* | 6/2017 | Grubic | G01R 31/44 |

FOREIGN PATENT DOCUMENTS

| | | |
|---|---|---|
| JP | 2010-288352 A | 12/2010 |
| JP | 2014-516154 A | 7/2014 |
| JP | 2015-72006 A | 4/2015 |
| JP | 2015-215275 A | 12/2015 |
| WO | 2012/152353 A1 | 11/2012 |

* cited by examiner

POWER GENERATION EQUIPMENT MONITORING SYSTEM, POWER GENERATION EQUIPMENT MONITORING METHOD AND PROGRAM

CROSS-REFERENCE TO RELATED APPLICATIONS

This application is the U.S. National Phase under 35 U.S.C. § 371 of International Application No. PCT/JP2017/017222 filed on May 2, 2017, which claims the benefit of Japanese Application No. 2016-094060 filed on May 9, 2016, the entire contents of each are hereby incorporated by reference.

TECHNICAL FIELD

The invention relates generally to power generation equipment monitoring systems, power generation equipment monitoring methods and programs and, more particularly, to a power generation equipment monitoring system used for monitoring power generation equipment that converts rotational energy of a rotor into electric energy, a power generation equipment monitoring method and a program.

BACKGROUND ART

Patent Literature 1 describes a power generation equipment monitoring system (a status monitoring system for a wind turbine generator) that detects presence and absence of a malfunction in power generation equipment such as a wind turbine generator with a vibration sensor. The wind turbine generator described in Patent Literature 1 possesses a nacelle to be installed at the top of a tower and a rotor (a rotor head) to which blades are attached. The rotor is connected with a main shaft introduced inside the nacelle. The main shaft is connected to an input shaft of a step-up gear whose output shaft is connected to the generator.

The power generation equipment monitoring system described in Patent Literature 1 includes a vibration sensor that detects mechanical vibration of a bearing for the main shaft, and a vibration sensor that detects mechanical vibration occurring in the wind turbine generator. The power generation equipment monitoring system monitors a malfunction in the bearing, or reduction in mechanical strength (rigidity) of the tower by using respective outputs of the vibration sensors. These vibration sensors are composed of an acceleration sensor with, for example a piezoelectric device, and provided in the proximity of a location of vibration, namely inside the nacelle or in the proximity of the nacelle in order to detect mechanical vibration occurring in the wind turbine generator.

The abovementioned related power generation equipment monitoring system however requires that the vibration sensors are installed in the proximity of the occurrence location of vibration. In the case of, for example wind turbine generator, it is necessary to install such vibration sensors at a high place of the nacelle and the like, and therefore the installation of the vibration sensors is very troublesome and hinders the introduction of power generation equipment monitoring systems.

CITATION LIST

Patent Literature

Patent Literature 1: JP 2015-72006 A

SUMMARY OF INVENTION

With the foregoing in view, it is an object of the present invention to provide a power generation equipment monitoring system that is easy to introduce, a power generation equipment monitoring method and a program.

A power generation equipment monitoring system in accordance with a first aspect of the present invention includes a receiver and a determining processor. The receiver is configured to acquire, from a measuring device configured to measure output currents of power generation equipment, waveform data representing waveform of the output currents. The power generation equipment is configured to convert rotational energy of a rotor thereof into electric energy to output AC voltage with a reference frequency. The determining processor is configured to determine presence and absence of a malfunction in a rotary block according to the waveform data acquired through the receiver. The rotary block is configured to apply motive power to the rotor of the power generation equipment. The determining processor 12 is configured to determine the presence and absence of the malfunction based on a component of at least one specific frequency arranged at one or more intervals according to a rotational speed of the rotor from the reference frequency on a frequency axis in a frequency spectrum of the output currents.

In a power generation equipment monitoring system in accordance with a second aspect of the present invention according to the first aspect, the determining processor is configured to determine the presence and absence of the malfunction based on respective components of two or more specific frequencies.

In a power generation equipment monitoring system in accordance with a third aspect of the present invention according to the first aspect or the second aspect, the power generation equipment includes a stator with armature windings, and is configured to generate the AC voltage by rotation of the rotor relative to the stator. The measuring device is configured to measure, as the output currents, an output of the armature windings.

In a power generation equipment monitoring system in accordance with a fourth aspect of the present invention according to the third aspect, the rotor includes field windings. The power generation equipment monitoring system further includes an estimating processor configured to calculate the rotational speed of the rotor according to at least an output of the field windings.

In a power generation equipment monitoring system in accordance with a fifth aspect of the present invention according to the fourth aspect, the estimating processor is configured to calculate the rotational speed of the rotor according to the output of the armature windings in addition to the output of the field windings.

A power generation equipment monitoring method in accordance with a sixth aspect of the present invention includes a receiving step and a determining step. The receiving step includes acquiring, from a measuring device configured to measure output currents of power generation equipment, waveform data representing waveform of the output currents. The power generation equipment is configured to convert rotational energy of a rotor thereof into electric energy to output AC voltage with a reference frequency. The determining step includes determining presence and absence of a malfunction in a rotary block according to the waveform data acquired through the receiving step. The rotary block is configured to apply motive power to the rotor of the power generation equipment. The determining step includes determining the presence and absence of the malfunction based on a component of at least one specific frequency arranged at one or more intervals according to a rotational speed of the rotor from the reference frequency on a frequency axis in a frequency spectrum of the output currents.

In a power generation equipment monitoring method in accordance with a seven aspect of the present invention according to the fifth aspect, the determining step includes determining the presence and absence of the malfunction based on respective components of two or more specific frequencies.

In a power generation equipment monitoring method in accordance with an eighth aspect of the present invention according to the sixth aspect or the seventh aspect, the power generation equipment includes a stator with armature windings and is configured to generate the AC voltage according to rotation of the rotor relative to the stator. The measuring device is configured to measure, as the output currents, an output of the armature windings.

In a power generation equipment monitoring method in accordance with a ninth aspect of the present invention according to the eighth aspect, the rotor includes field windings. The power generation equipment monitoring method further includes an estimating step calculating the rotational speed of the rotor according to at least an output of the field windings.

In a power generation equipment monitoring method in accordance with a tenth aspect of the present invention according to the ninth aspect, the estimating step includes calculating the rotational speed of the rotor according to the output of the armature windings in addition to the output of the field windings.

A program according to an eleventh aspect of the present invention causes a computer to function as a receiver and a determining processor. The receiver acquires, from a measuring device configured to measure output currents of power generation equipment, waveform data representing waveform of the output currents. The power generation equipment is configured to convert rotational energy of a rotor thereof into electric energy to output AC voltage with a reference frequency. The determining processor determines presence and absence of a malfunction in a rotary block according to the waveform data acquired through the receiver. The rotary block is configured to apply motive power to the rotor of the power generation equipment. The determining processor determines the presence and absence of the malfunction based on a component of at least one specific frequency arranged at one or more intervals according to a rotational speed of the rotor from the reference frequency on a frequency axis in a frequency spectrum of the output currents.

DESCRIPTION OF EMBODIMENTS

Embodiment 1

(Schema)

Figure 1:
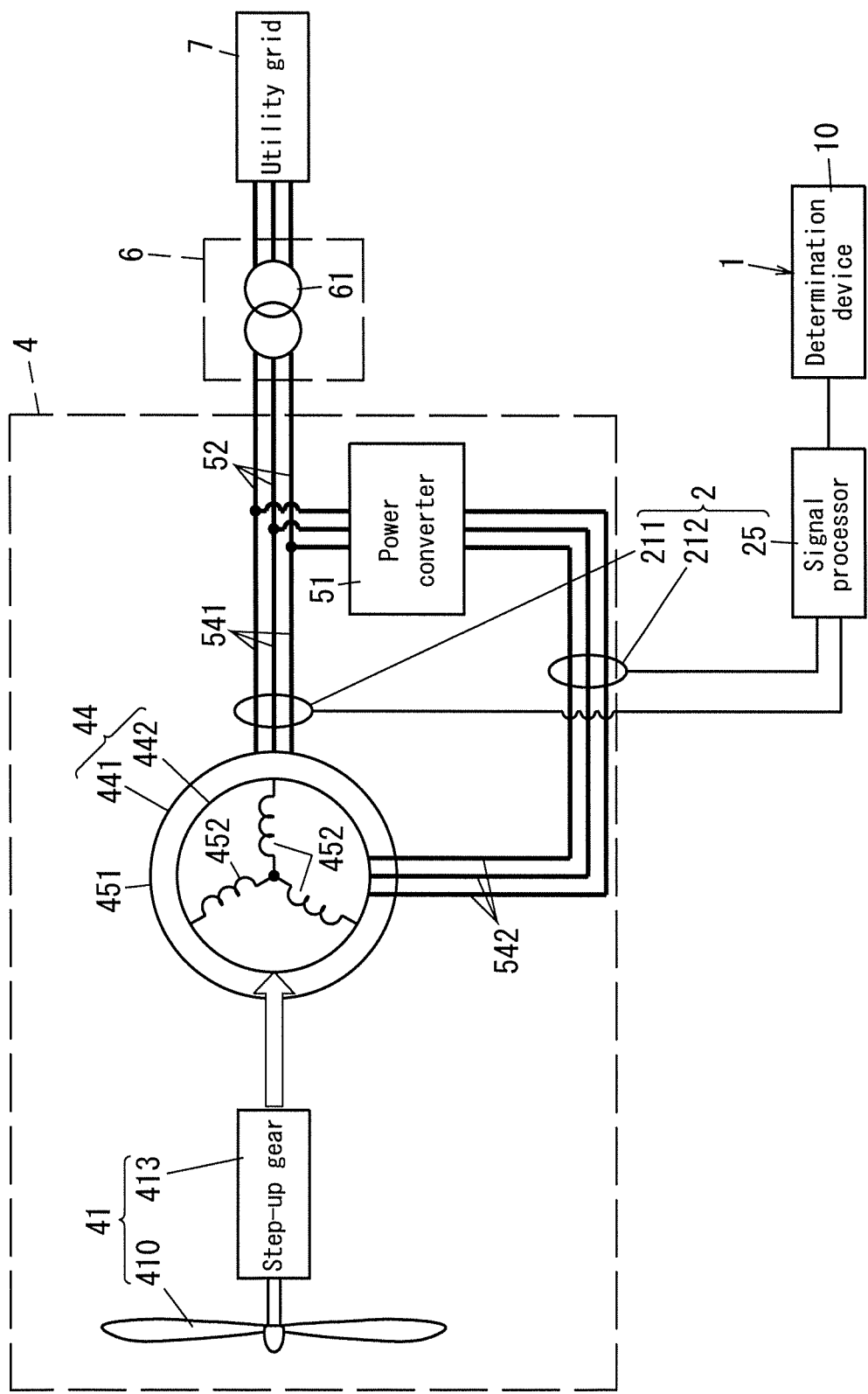
FIG. 1 is a schematic block diagram of a power generation equipment monitoring system in accordance with Embodiment 1.

As shown in FIG. 1, a power generation equipment monitoring system 1 in accordance with the present embodiment is utilize for monitor of power generation equipment 4 configured to convert rotational energy of a rotor 442 thereof into electric energy. Examples of this sort of power generation equipment 4 include wind turbine generating equipment that rotates a wind wheel by wind power, hydroelectric power equipment that rotates a water wheel for power generation by water power, and thermal power equipment and nuclear power equipment that rotate a turbine by steam or combustion gas. Examples thereof further include geothermal power equipment, pumped storage power equipment, and wave activated power equipment.

This sort of power generation equipment 4 includes a rotary block 41 configured to apply motive power to the rotor 442 in order to rotate the rotor 442 to generate electric energy. The rotary block 41 stated herein includes a rotary body 410 (in the wind turbine generating equipment, the wind wheel), and components associated with the rotation of the rotary body 410 or the rotor 442 (e.g., a shaft, a bearing and a step-up gear 413). In this sort of power generation equipment 4, there is a possibility that a malfunction may occur in the rotary block 41 as a result of aged deterioration and the like of at least one component included in the rotary block 41. Examples of "a malfunction . . . in the rotary block 41" stated herein include all malfunctions of the rotary block 41, such as malfunctions of a main shaft 411 (see FIG. 2), a bearing 412 (see FIG. 2) and the step-up gear 413 (see FIG. 2) besides malfunctions of the rotary body 410 itself (deformation, fracture and the like). Specific examples of a malfunction of the rotary block 41 will be described in "(2.2) Malfunction in rotary block" below. In a state where the rotary block 41 has a malfunction, the power generation equipment 4 continuing to operate may cause a serious damage to the power generation equipment 4 due to the progress of damage and the like.

Therefore, the power generation equipment monitoring system 1 in accordance with the present embodiment will determine presence and absence of a malfunction in the rotary block 41 of the power generation equipment 4, thereby enabling early detection of the malfunction in the rotary block 41. The power generation equipment monitoring system 1 determining the presence of the malfunction in the rotary block 41 enables a user to take countermeasures such as maintenance (including inspection and repair) of the power generation equipment 4 before occurrence of serious damage to the power generation equipment 4. That is, the power generation equipment monitoring system 1 monitoring the power generation equipment 4 enables a user to recognize a symptom of damage to the power generation equipment 4 to take appropriate countermeasures before occurrence of serious damage to the power generation equipment 4. It is accordingly possible to hinder the progress of damage. The "user" stated herein may be, for example, a business organization or an individual that is a management business owner of the power generation equipment 4.

(2) Details

The power generation equipment monitoring system 1 in accordance with the present embodiment will be explained below in detail.

(2.1) Power Generation Equipment

First, the power generation equipment 4 as a monitored target by the power generation equipment monitoring system 1 in accordance with the present embodiment will be explained. The present embodiment exemplifies wind turbine generator equipment as the power generation equipment 4.

Figure 2:
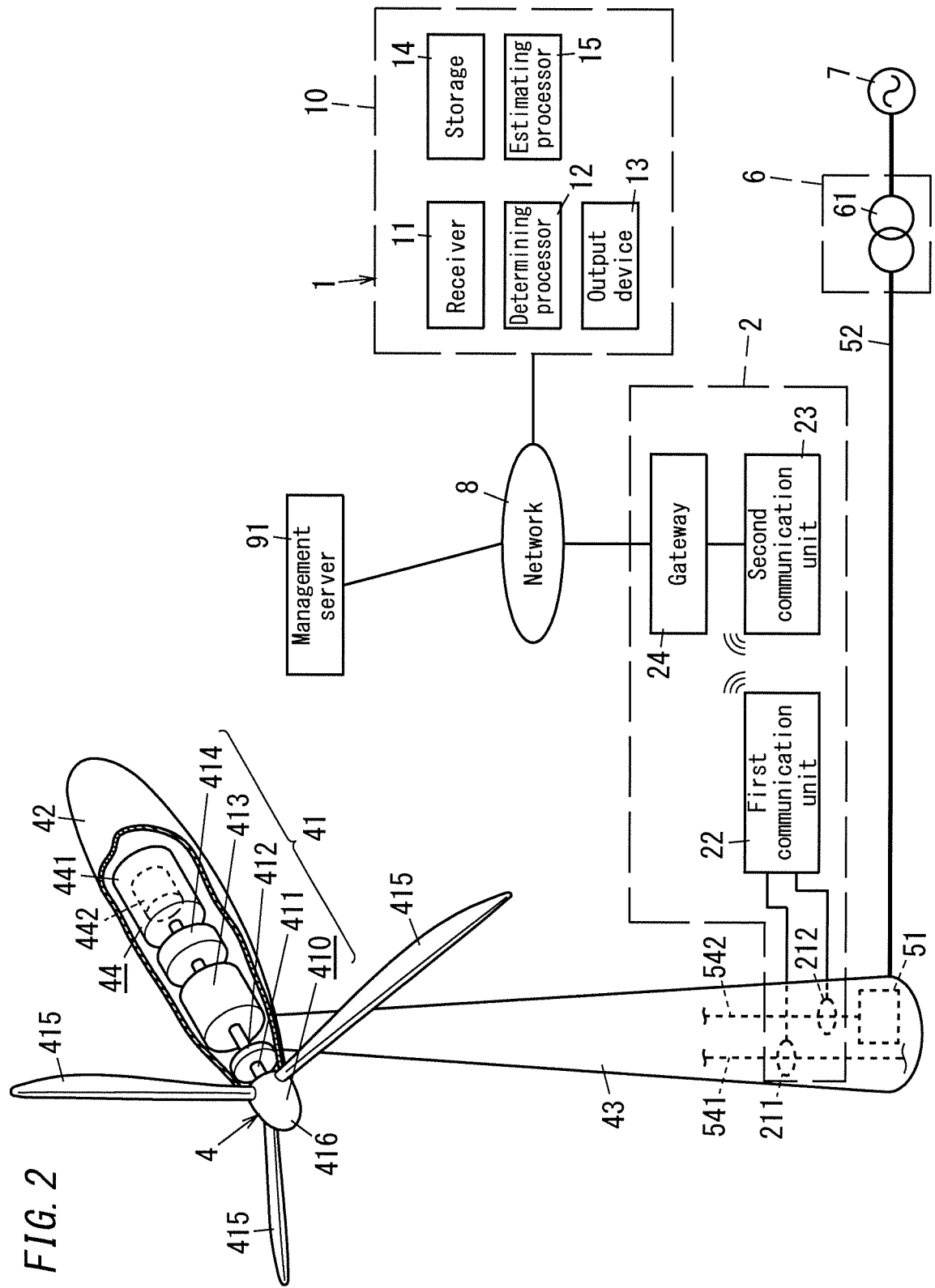
FIG. 2 is a more detailed block diagram of the power generation equipment monitoring system.

As shown in FIG. 2, the power generation equipment 4 is propeller type of wind turbine generator equipment that includes, as the rotary body 410, a wind wheel with blades 415. Besides the rotary body 410, the power generation equipment 4 includes a nacelle 42 that holds and allows the rotary body 410 to rotate, and a tower 43 that supports the nacelle 42. The nacelle 42 is attached to an upper end of the tower 43 roughly tens of meters tall above the ground. The main shaft 411, the bearing 412, the step-up gear 413 and a braking device 414 constitute the rotary block 41 along with the rotary body 410, and are provided in the nacelle 42 of the power generation equipment 4. The power generation equipment 4 further includes a generator 44 in the nacelle 42.

In the example of FIG. 2, the rotary body 410 possesses two or more (here, three) blades 415 and a hub 416. The blades 415 are radially arranged with the hub 416 centered, and are connected to the main shaft 411 through the hub 416. The bearing 412 in the nacelle 42 holds and allows the main shaft 411 to rotate, and the main shaft 411 is connected to an input shaft of the step-up gear 413. An output shaft of the step-up gear 413 is connected to the generator 44 via the braking device 414. Thus, when the blades 415 receive wind to rotate the rotary body 410, the rotation of the rotary body 410 is increased with the step-up gear 413 to be transmitted to the generator 44.

The generator 44 includes a stator 441 and the rotor 442. As shown in FIG. 1, the stator 441 possesses armature windings 451 and the rotor 442 possesses field windings 452. The rotor 442 is connected to the output shaft of the step-up gear 413 via the braking device 414. The output shaft of the step-up gear 413 rotates, thereby rotating the rotor 442 relative to the stator 441. The armature windings 451 are electrically connected to power supply conductors 52 via armature-side electric conductors 541. The field windings 452 are electrically connected to the power supply conductors 52 via field-side electric conductors 542 and a power converter 51. The power converter 51 is composed of a two way inverter of, for example a Back To Back (BTB) type or the like.

Here, the armature-side electric conductors 541 are composed of electric conductors that are part of electric conductors between the generator 44 and the power supply conductors 52 and are on the side of the armature windings 451 in the power supply conductors 52 as seen from junctions of the power converter 51 and the power supply conductors 52. The field-side electric conductors 542 are composed of electric conductors that are part of electric conductors between the generator 44 and the power supply conductors 52 and are on the side of the field windings 452 as seen from the armature windings 451. That is, the field-side electric conductors 542 are composed of electric conductors between the power converter 51 and the field windings 452. The field-side electric conductors include a slip ring. In FIG. 1, the armature windings 451 are included in the stator 441. Therefore, the same portion is assigned Reference Sign "441" of the stator and Reference Sign "451" of the armature windings.

As an example of the present embodiment, the generator 44 is a Doubly Fed Induction Generator (DFIG). This sort of generator 44 causes the power converter 51 to control a current flowing through the field windings 452 according to a variable speed operation, thereby providing the power supply conductors 52 with AC voltage whose frequency is the same as that of a utility grid 7 (e.g., 50 [Hz]). The power converter 51 supplies electric power from the power supply conductors 52 to the field windings 452 when a rotational speed of the rotor 442 is less than a synchronous speed (sub-synchronous operation), namely when a slip has a positive value. The "slip" stated herein is a value obtained by dividing a difference by the synchronous speed, where the difference is a value obtained by subtracting the rotational speed of the rotor 442 from the synchronous speed. On the other hand, the power converter 51 supplies electric power from the field windings 452 to the power supply conductors 52 when the rotational speed of the rotor 442 is equal to or greater than the synchronous speed (super synchronous operation), namely when the slip has a negative value. Each unit of the "rotational speed" and the "synchronous speed" stated herein is "rpm". Thus, AC power with a slip frequency is supplied to the field windings 452 according to "slip frequency control", thereby enabling the generator 44 to maintain a generation power frequency at the same frequency as that of the utility grid 7 even when the rotational speed of the rotary body 410 is not constant.

The armature-side electric conductors 541 pass inside the tower 43 and electrically connect between the generator 44 in the nacelle 42 and the power supply conductors 52. The power converter 51 is installed in a lower part of the tower 43. The field-side electric conductors 542 pass inside the tower 43 and electrically connect between the generator 44 in the nacelle 42 and the power converter 51. Here, three-phase AC system of U-phase, V-phase and W-phase is assumed as the utility grid 7, and three armature windings 451 and three field windings are provided for the three-phase AC system. In addition, conductors of each of the power supply conductors, the armature-side electric conductors 541 and the field-side electric conductors 542 are composed of three covered conductors in conformity with the three-phase AC system.

The generator 44 is electrically connected with interconnection equipment 6 via the power supply conductors 52. Accordingly, power generated with the power generation equipment 4 is to be transmitted to the interconnection equipment 6 via the power supply conductors 52. In other words, the generator 44 is electrically connected with a "load" of the interconnection equipment 6 via the power supply conductors 52.

The interconnection equipment 6 is equipment that interconnects the power generation equipment 4 with the utility grid 7. Here, as an example, the interconnection equipment 6 includes a transformer 61. The power supply conductors 52 are electrically connected to primary windings of the transformer 61. Secondary windings of the transformer 61 are electrically connected to the utility grid 7. An output of the power generation equipment 4 is provided to the utility grid 7 in synchronization with voltage and frequency of the utility grid 7. The interconnection equipment 6 may be provided with a protection system including an isolation switch.

With the power generation equipment 4 as stated above, when the rotor 442 rotates, the interconnection equipment 6 is supplied with electric power (electric energy) from the generator 44 via the power supply conductors 52. In other words, when the rotor 442 rotates according to motive power applied thereto from the rotary block 41, the power generation equipment 4 converts rotational energy of the rotor 442 into electric energy. Here, the power generation equipment 4 outputs AC voltage with a reference frequency. The reference frequency is the same frequency as that of the utility grid 7 (for example, 50 [Hz]).

The nacelle 42 is provided with a wind direction indicator and a wind speed indicator that measures a wind direction and a wind speed, respectively, and the power generation equipment 4 performs control according to the wind direction and the wind speed. That is, for example, a yaw driving device rotates the nacelle 42 in a horizontal plane according to the wind direction, and thereby the power generation equipment 4 efficiently performs power generation while following the wind direction. The power generation equipment 4 also varies a setting angle (a pitch angle) of the blades 415 according to the wind speed, thereby maintaining the output (electric power) of the generator 44 at a rated value.

(2.2) Malfunction in Rotary Block

With the power generation equipment 4 having the configuration explained in the abovementioned "(2.1) Power generation equipment", malfunctions to be described below may occur in the rotary block 41.

That is, in the power generation equipment 4, there is a possibility that a malfunction will occur in the rotary block 41 caused by, for example, aged deterioration and the like of components included in the rotary block 41. The problem of the aged deterioration is inevitable in the power generation equipment such as the wind turbine generator equipment in which the rotary body 410 rotates by natural energy because direction and strength of force exerting on the rotary body 410 are easy to change.

For example, if a gust of wind blows from bottom to top (blows up), force exerts on the rotary body 410 of the wind turbine generator equipment in a direction in which the main shaft 411 tilts. In this case, stress is applied to the bearing 412 because the main shaft 411 twists the bearing 412. If the bearing 412 is a rolling bearing, such stress is repeatedly applied to the bearing 412, which may thereby cause damage thereto due to braking. The "braking" stated herein means peeling or the like occurred in a rolling contact surface or a raceway surface thereof caused by rolling contact fatigue.

When the breaking occurs in the bearing 412, a large loss occurs in the bearing 412, thereby reducing generating efficiency of the power generation equipment 4. In addition, if the power generation equipment 4 continues operating in such a state, the main shaft 411 tilts and misalignment occurs. In this case, there is a possibility that, for example, slippage will occur in gear of the step-up gear 413 with the gears rubbing against each other. As a result, damage to the gears such as fracture, cracks or flaws may occur. Such damage may occur not only in the step-up gear 413 but also in the braking device 414 and the generator 44.

In short, the power generation equipment 4 operating with any malfunction occurring in the rotary block 41 (e.g., braking of bearing 412) may not only reduce the generating efficiency of the power generation equipment 4 but also cause serious damage to the power generation equipment 4 due to progress of the damage. Therefore, the power generation equipment monitoring system 1 in accordance with the present embodiment determines presence and absence of a malfunction in the rotary block 41 to notify a user of a determination result, thereby enabling the user to recognize the malfunction in the rotary block 41 at an early stage.

(2.3) Configuration of Power Generation Equipment Monitoring System

The configuration of the power generation equipment monitoring system 1 will be next explained.

As shown in FIG. 1, the power generation equipment monitoring system 1 includes a determination device 10 configured to determine presence and absence of a malfunction in the rotary block 41. The determination device 10 is configured to acquire one piece or more waveform data from a measuring device 2 configured to measure output currents of the power generation equipment 4 to determine presence and absence of a malfunction in the rotary block 41 based on the waveform data.

As shown in FIG. 2, the determination device 10 and the measuring device 2 in the present embodiment are connected to a network 8 such as, for example the Internet to be allowed to communicate with each other. This therefore enables the determination device 10 to acquire one piece or more waveform data from the measuring device 2 via the network 8. In addition, the network 8 is connected with a management server 91 under user management. This enables the determination device 10 to provide the management server 91 with a determination result of presence and absence of a malfunction in the rotary block 41 via the network 8. The management server 91 therefore makes it possible to present the determination result of the presence and absence of the malfunction in the rotary block 41 to a user. This consequently enables the user to take countermeasures such as maintenance (including inspection and repair) of the power generation equipment 4 before occurrence of serious damage to the power generation equipment 4. In the present embodiment, it is assumed that a user is a business organization that is a management business owner of the power generation equipment 4.

In the explanation of the present embodiment, the measuring device 2 is not included in components of the power generation equipment monitoring system 1. However, the measuring device 2 may be included in the components of the power generation equipment monitoring system 1. Similarly, in the explanation, the power generation equipment 4 is not included in the components of the power generation equipment monitoring system 1. However, the power generation equipment 4 may be included in the components of the power generation equipment monitoring system 1. That is, the power generation equipment monitoring system 1 that needs to include at least the determination device 10 may further include at least one of the measuring device 2 and the power generation equipment 4.

(2.3.1) Measuring Device

As shown in FIG. 1, the measuring device 2 possesses a first sensor 211, a second sensor 212 and a signal processor 25. The measuring device 2 is configured to measure output signals of the power generation equipment 4 to provide the determination device 10 with a waveform data set each of which represents waveform of output signals of the power generation equipment 4.

Each of the first and second sensors 211 and 212 is a current sensor such as, for example a current transformer (CT). The first sensor 211 is installed in the tower 43 (see FIG. 2) of the power generation equipment 4 and attached to the armature-side electric conductors 541 to detect a current flowing through the armature-side electric conductors 541. The second sensor 212 is installed in the tower 43 of the power generation equipment 4 and attached to the field-side electric conductors 542 to detect a current flowing through the field-side electric conductors 542. Each of the first and second sensors 211 and 212 is electrically connected to the signal processor 25. Here, the first sensor 211 needs to be attached to at least one of the three armature-side electric conductors 541 corresponding to the three-phase AC system, while the second sensor 212 needs to be attached to at least one of the three field-side electric conductors 542 corresponding to the three-phase AC system. For example, the first sensor 211 may be attached only to any one of the armature-side electric conductors 541, or two or three of the armature-side electric conductors 541.

The signal processor 25 is configured to produce waveform data (hereinafter referred to as "armature-side data") representing the waveform of output currents of the armature windings 451 from an output of the first sensor 211. The signal processor 25 is also configured to produce waveform data (hereinafter referred to as "field-side data") representing the waveform of output currents of the field windings 452 from an output of the second sensor 212. Thus, the measuring device 2 is configured to transmit, to the determination device 10, a waveform data set (armature-side data and field-side data) produced with the signal processor 25.

The present embodiment includes, as the output of the power generation equipment 4, two outputs that are both of the output of the armature windings 451 and the output of the field windings 452. Here, when simply referring to the output currents of the power generation equipment 4, it means the output of the armature windings 451. In other words, the measuring device 2 is configured to measure the output of the armature windings 451 as the output currents of the power generation equipment 4.

A specific configuration of the measuring device 2 will be next explained with reference to FIG. 2.

In addition to the first and second sensors 211 and 212, the measuring device 2 possesses a first communication unit 22, a second communication unit 23 and a gateway 24. Hereinafter, it is assumed that a function of the signal processor 25 (see FIG. 1) is included in the first communication unit 22.

The first and second sensors 211 and 212 are installed in the lower part of the tower 43 near the power converter 51. In other words, the first and second sensors 211 and 212 are installed near the ground. Each of the first and second sensors 211 and 212 is electrically connected with the first communication unit 22 and configured to provide its own detection result to the first communication unit 22. Various sensors may be applied to the first and second sensors 211 and 212. It is however preferable that each of the first and second sensors 211 and 212 have, for example a configuration, which allows retrofit thereof without disconnecting the armature-side electric conductors 541 and the field-side electric conductors 542, such as a clamp type sensor.

The first communication unit 22 is configured to perform mutual data transmission between the first communication unit 22 and the second communication unit 23. Communication between the first communication unit 22 and the second communication unit 23 may be radio communication such as, for example low-power radio (specified low-power radio) requiring no license. For this sort of low-power radio, specifications such as the frequency band and antenna power to be used according to the application or the like are specified in each country. In Japan, low power radio using radio waves of 920 MHz band and 420 MHz band is specified. However, the communication system between the first and second communication units 22 and 23 is not limited to this example. For example, the communication system may be communication using mobile phone network (carrier network) such as third generation (3G) line provided by telecommunications carrier, or wired communication.

The gateway 24 is electrically connected with the second communication unit 23. The gateway 24 further includes a function that is allowed to be connected to the network 8 (e.g., the Internet) via mobile phone network (carrier network) such as third generation (3G) line provided by telecommunications carrier. However, the gateway 24 is not limited to this configuration. The gateway 24 may be configured to be connected to the network 8 without going through the mobile phone network.

The configuration stated above enables the measuring device 2 to transmit a waveform data set (armature-side data and field-side data) produced with the signal processor 25 from the first communication unit 22 to the determination device 10 via the second communication unit 23, the gateway 24 and the network 8. The gateway 24 also possesses a function as data logger that stores the waveform data set acquired (collected) from the first communication unit 22.

Operating power of the measuring device 2 may be supplied from the utility grid 7 or the power generation equipment 4.

Here, the measuring device 2 is configured to provide the determination device 10 with waveform data sets at regular intervals. At predetermined measuring intervals (e.g., intervals of 4 hours), the measuring device 2 provides the determination device 10 with waveform data sets by measuring output currents of the power generation equipment 4. Each measuring interval may be measured by respective timers provided for the first and second sensors 211 or a timer provided for the gateway 24. In case each measuring interval is measured with the gateway 24, each measuring interval may be set (varied) remotely as a result of the management server 91 accessing the gateway 24.

(2.3.2) Determination Device

As shown in FIG. 2, the determination device 10 possesses a receiver 11, a determining processor 12, an output device 13, a storage 14 and an estimating processor 15. In the determination device 10, the receiver 11 acquires one piece or more waveform data from the measuring device 2, and the determining processor 12 determines presence and absence of a malfunction in the rotary block 41. The determination device 10 includes, as a main component, a computer with a processor and a memory, and the processor executes a program stored in the memory, thereby realizing functions as the determination device 10.

The receiver 11 is configured to acquire, from the measuring device 2, at least a piece of waveform data (armature-side data) representing the waveform of corresponding output currents of the power generation equipment 4. Herein, the receiver 11 is configured to acquire the waveform data from the gateway 24 of the measuring device 2 via the network 8. The waveform data to be acquired through the receiver 11 are raw data just representing the current waveform with no processing applied to the current waveform except compression and the like. Herein, the waveform of currents detected with the first sensor 211 or the second sensor 212 for predetermined time (e.g., for about a few seconds to a minute) corresponds to a piece of waveform data. In the present embodiment, the waveform data as an example are contained in a wav file of about 200 [Kbyte] per phase.

The determining processor 12 is configured to determine presence and absence of a malfunction in the rotary block 41 according to the waveform data acquired through the receiver 11. The determining processor 12 analyzes the waveform data acquired through the receiver 11 to determine presence and absence of a malfunction in the rotary block 41 according to determination conditions. The determining processor 12 determines the presence and absence of the malfunction in the rotary block 41 based on a frequency analysis result of the output currents of the power generation equipment 4. Specifically, the determining processor 12 applies the Fourier transform such as, for example the fast Fourier transform (FFT) to the waveform data (armature-side data) representing the waveform of the corresponding output currents of the power generation equipment 4, thereby calculating the frequency spectrum of the output currents. The determining processor 12 then analyzes the frequency spectrum to determine the presence and absence of the malfunction according to the determination conditions. Determination algorithm for the determining processor 12 will be described in detail in "(2.4) Determination algorithm".

The output device 13 outputs a determination result by the determining processor 12. The output device 13 is configured to transmit the determination result to the management server 91 via the network 8. The determination result transmitted from the output device 13 is data representing at least presence and absence of a malfunction in the rotary block 41, and may include data presenting, for example, an occurrence place of the malfunction, a level of the malfunction (degree of the malfunction), and a corresponding countermeasure. Output examples of the determination result stated herein include presentation (e.g., display, audio output, printing and the like) and notification of the determination result.

The storage 14 stores pieces of waveform data acquired through the receiver 11. The pieces of waveform data stated herein may be pieces of waveform data detected twice or more with the single first sensor 211 (or second sensor 212), or pieces of waveform data individually obtained from respective outputs of first sensors 211 (or second sensors 212). Furthermore, the pieces of waveform data may be pieces of waveform data detected twice or more with first sensors 211 (or second sensors 212). An example of first sensors 211 (or second sensors 212) will be explained in "(2.6) Application example of power generation equipment monitoring system".

The estimating processor 15 is configured to calculate the rotational speed of the rotor 442 in the power generation equipment 4. That is, with the power generation equipment 4, the rotational speed of the rotor 442 varies according to, for example a wind speed and is not constant. Although the power generation equipment 4 may be additionally provided with a rotational speed monitor that monitors the rotational speed of the rotor 442, the estimating processor 15 makes it possible to estimate the rotational speed of the rotor 442 without the rotational speed monitor.

In the present embodiment, the estimating processor 15 is configured to calculate the rotational speed of the rotor 442 according to at least an output of the field windings 452. That is, the estimating processor 15 is to estimate the rotational speed of the rotor 442 according to at least waveform data (armature-side data) that are included in pieces of waveform data acquired through the receiver 11 and represent waveform of output currents of the field windings 452. The estimating processor 15 is further configured to calculate the rotational speed of the rotor 442 according to an output of the armature windings 451 in addition to an output of the field windings 452. That is, the estimating processor 15 is to estimate the rotational speed of the rotor 442 based on not only the field-side data but also the waveform data (armature-side data) representing waveform of output currents of the armature windings 451. An estimation algorithm of the rotational speed of the rotor 442 by the estimating processor 15 will be described in detail in "(2.5) Rotational speed estimating algorithm".

The configuration stated above enables the determination device 10 to determine presence and absence of a malfunction in the rotary block 41 of the power generation equipment 4 according to one piece or more waveform data acquired from the measuring device 2 to provide a determination result to management server 91. The management server 91 therefore makes it possible to present the determination result of the presence and absence of the malfunction in the rotary block 41 to a user. This consequently enables the user to take countermeasures such as maintenance (including inspection and repair) of the power generation equipment 4 before occurrence of serious damage to the power generation equipment 4.

Note that the determination device 10 may be configured to output the determination result only when the power generation equipment 4 is in operation. For example, the determination device 10 determines whether or not the power generation equipment 4 is in operation based on one piece or more waveform data acquired from the measuring device 2. When the power generation equipment 4 generates electric power equal to or greater than a predetermined minimum power value, the determination device 10 determines that the power generation equipment 4 is in operation. When the power generation equipment 4 is not in operation, the determination device 10 does not determine presence and absence of a malfunction in the rotary block 41, but outputs, for example information indicating that the present and absence of the malfunction cannot be determined.

In the determination device 10, predetermined conditions prescribed by default or conditions to be non-periodically updated may be applied as the determination conditions for the determining processor 12. In case the determination conditions are non-periodically updated, the determining processor 12 updates the determination conditions based on pieces of waveform data stored in the storage 14. In other words, the algorithm for determination of the determining processor 12 is to be changed automatically based on machine learning. In case multiple pieces of waveform data are stored in the storage 14, the determination conditions may be updated automatically based on the multiple pieces of waveform data-so-called big data.

(2.4) Determination Algorithm

An operation of the determining processor 12 for determining presence and absence of a malfunction in the rotary block 41, namely determination algorithm for the determining processor 12 will be next explained in detail.

Figures 3A, 3B:
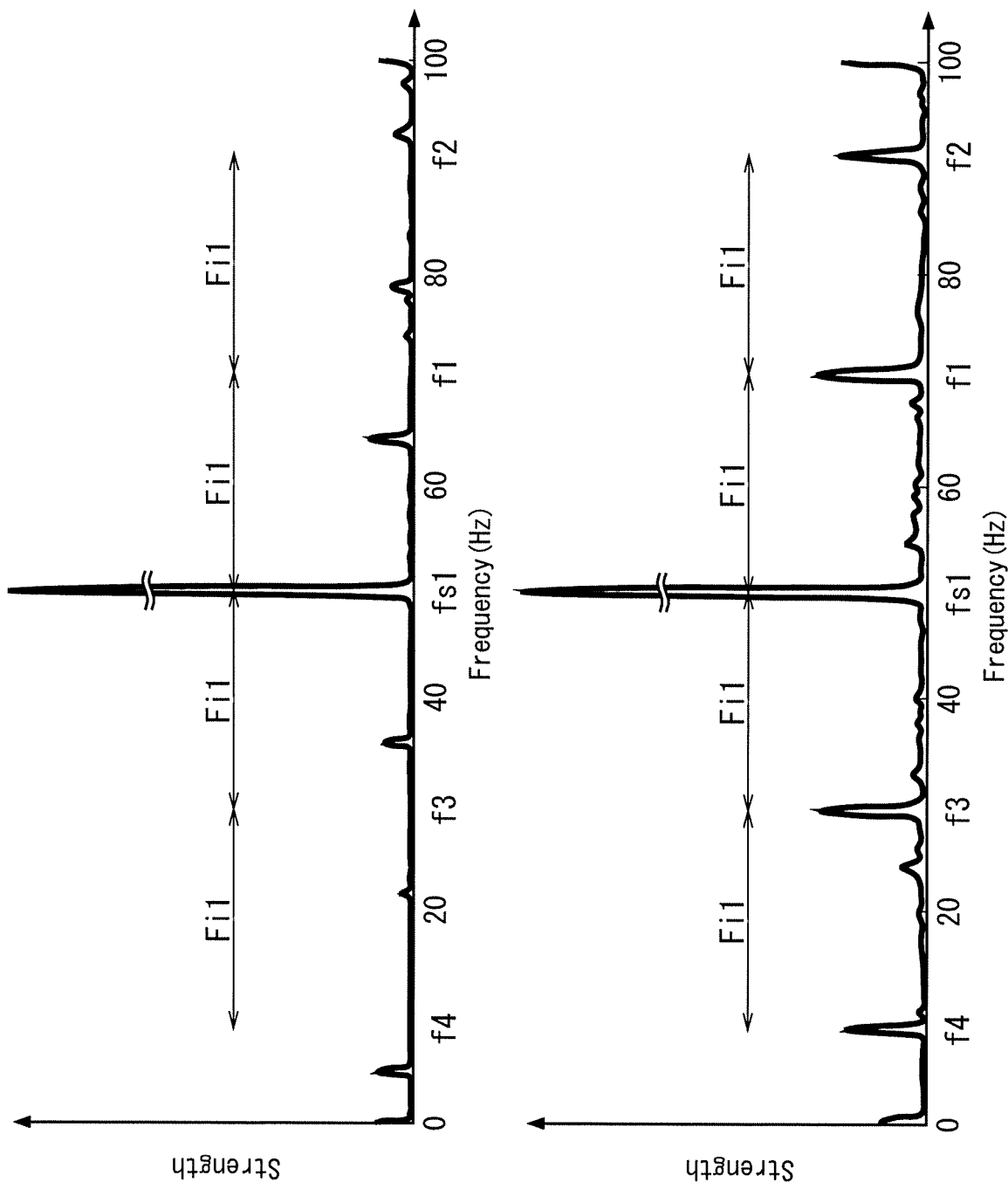
FIG. 3A shows a frequency spectrum of output currents through armature windings during absence of a malfunction.
FIG. 3B shows a frequency spectrum of output currents through the armature windings during presence of a malfunction.

Herein, it is assumed that frequency spectra as illustrated in FIGS. 3A and 3B are obtained as a result of the determining processor 12 applying the fast Fourier transform to waveform data (armature-side data) representing waveform of corresponding output currents of the power generation equipment 4. In FIGS. 3A and 3B, each horizontal axis represents frequency [Hz] and each vertical axis represents intensity (component size). FIG. 3A represents absence of the malfunction (namely, normal state), and FIG. 3B represents presence of the malfunction.

As is clear from FIGS. 3A and 3B, when a malfunction occurs in the rotary block 41, some change occurs in the waveform of output currents of the power generation equipment 4. The frequency spectrum varies accordingly. Therefore, the determining processor 12 detects variation in the frequency spectrum, thereby enabling determination of presence and absence of the malfunction.

When a malfunction occurs, various variations occur in the frequency spectrum. The present inventors have obtained knowledge that when a malfunction occurs, a change appears in a component of at least one specific frequency. That is, a characteristic variation caused by a malfunction in the rotary block 41 appears in a component of at least one specific frequency in output currents of the power generation equipment 4. The "specific frequency" stated herein is a frequency arranged at an interval (hereinafter referred to as a "specific interval") according to the rotational speed of the rotor 442 from the reference frequency on the frequency axis. The "interval" stated herein is an interval between frequencies in the frequency spectrum, and therefore an interval between two frequencies corresponds to a difference value between the two frequencies. The reference frequency is a frequency of the AC voltage from the power generation equipment 4 (50 [Hz] in the examples of FIGS. 3A and 3B), and the same as that of the utility grid 7.

In the examples of FIGS. 3A and 3B, on each frequency axis (horizontal axis), the reference frequency fs1 and the four specific frequencies f1 to f4 are arranged at specific intervals Fi1 with the reference frequency fs1 (50 [Hz]) centered. Here, the intensity at the reference frequency fs1 has a global maximum. On a higher frequency side than the reference frequency fs1 on each frequency axis (horizontal axis), two specific frequencies f1 and f2 are arranged at specific intervals Fi1 (f1<f2). On a lower frequency side than the reference frequency fs1 on each frequency axis (horizontal axis), two specific frequencies f3 and f4 are arranged at specific intervals Fi1 (f3>f4). In other words, a relationship "f1=fs1+Fi1" holds between the specific frequency f1 and both the reference frequency fs1 and the specific interval Fi1. Similarly, a relationship "f2=fs1+2×Fi1" holds between the specific frequency f2 and both the reference frequency fs1 and the specific interval Fi1. A relationship "f3=fs1−Fi1" also holds between the specific frequency f3 and both the reference frequency fs1 and the specific interval Fi1. Similarly, a relationship "f4=fs1−2×Fi1" holds between the specific frequency f4 and both the reference frequency fs1 and the specific interval Fi1.

Focusing on the specific frequencies f1 to f4, the intensity of each component in the presence of a malfunction as shown in FIG. 3B is larger than the intensity of each component in the absence of a malfunction (in a normal state) as shown in FIG. 3A. Specifically, the frequency spectrum in the example of FIG. 3B has local maxima at the specific frequencies f1 to f4. That is, in the frequency spectrum as shown in FIG. 3B, local maxima points occur at specific intervals Fi1 with the reference frequency fs1 centered.

This was confirmed experimentally. That is, a characteristic variation caused by a malfunction in the rotary block 41 appeared in a component of at least one specific frequency f1, f2, f3, f4 arranged at one or more intervals (specific intervals Fi1) according to the rotational speed of the rotor 442 from the reference frequency fs1 on the frequency axis. Furthermore, this can also be explained mathematically. In short, when a malfunction occurs in the rotary block 41 of the power generation equipment 4, it is considered that a cyclic angular velocity change occurs in the rotation of the rotor 442. It is also considered that periodic distortion ("deviation" from an ideal sine wave of the reference frequency fs1) occurs in the output currents of the power generation equipment 4. A period of "distortion" stated herein is a cycle corresponding to the rotational speed of the rotor 442. Therefore, when the periodic distortion of the output currents is regarded as a "signal" and the ideal sine wave of the reference frequency fs1 is regarded as a "carrier wave", at least one sideband occurs on a high frequency side and a low frequency side of the carrier wave (reference frequency fs1), like a carrier wave modulated by a signal. Here, an interval of the sidebands corresponds to a frequency of the signal (periodic distortion of the output currents), and therefore the specific interval Fi1 is determined according to the rotational speed of the rotor 442. The occurrence of sidebands is evident from the frequency modulation or amplitude modulation equation.

Figure 4:
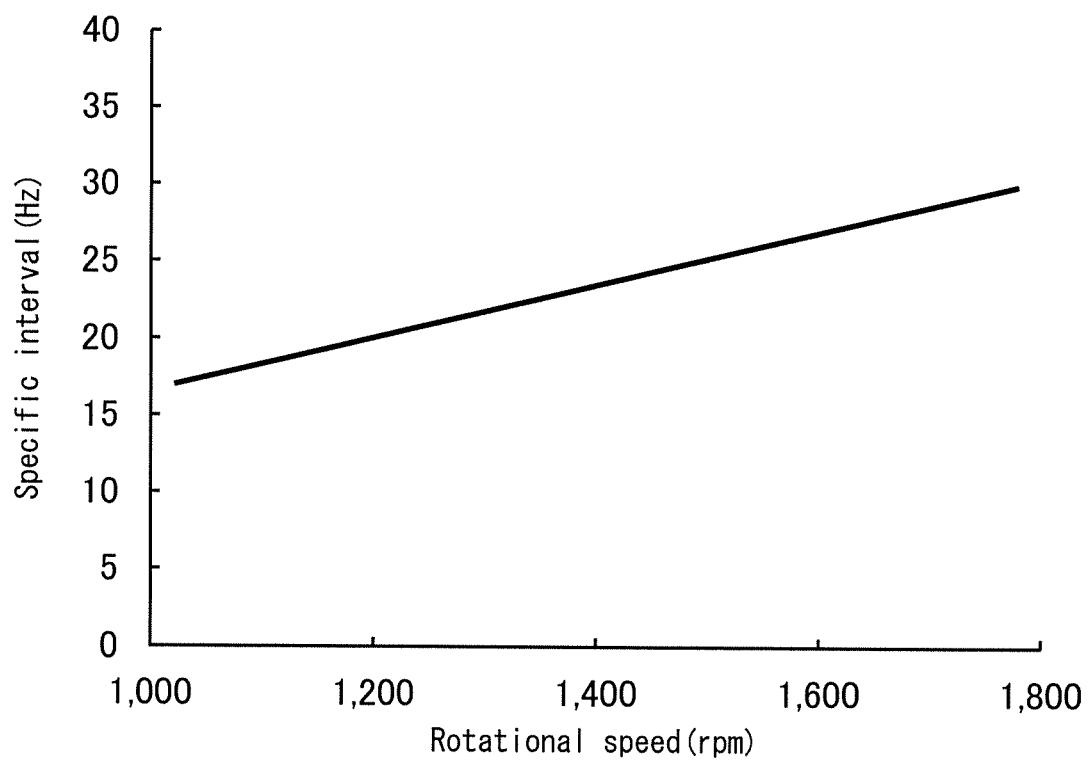
FIG. 4 is a graph of a relationship between a rotational speed of a rotor and a specific interval.

Therefore, the determining processor 12 determines presence and absence of a malfunction in the rotary block 41 based on a component of at least one specific frequency f1, f2, f3, f4 as stated above. Here, specifying a specific frequency f1 to f4 requires specifying a corresponding rotational speed of the rotor 442. Here, a specific interval Fi1 and a corresponding rotational speed of the rotor 442 have a correlation. That is, as illustrated in FIG. 4, as the rotational speed of the rotor 442 increases, the specific distance Fi1 also increases. In FIG. 4, a horizontal axis represents the rotational speed of the rotor 442 [rpm], and a vertical axis represents the specific interval [Hz]. Therefore, when a rotational speed of the rotor 442 is specified, a corresponding specific interval Fi1 is obtained. This enables the determining processor 12 to specify a specific frequency f1 to f4 from known reference frequency fs1 and specific interval Fi1.

A relationship between the specific interval Fi1 and the rotational speed of the rotor 442 as exemplified in FIG. 4 can be specified from, for example pieces of sample data to be described below. Each of the pieces of sample data are a frequency spectrum of output currents obtained for each rotational speed while varying the rotational speed of the rotor 442 for the power generation equipment 4 having a malfunction in the rotary block 41. A relationship between the specific interval Fi1 and the rotational speed of the rotor 442 can be specified from a correspondence relationship between each of the pieces of sample data and the rotational speed of the rotor 442.

In the present embodiment, from the rotational speed of the rotor 442 estimated with the estimating processor 15, the determining processor 12 finds a corresponding specific interval Fi1 and specifies a specific frequency f1 to f4 according to the specific interval Fi1. The determining processor 12 extracts a component of the specific frequency f1 to f4 from the frequency spectrum of output currents of the power generation equipment 4 to determine presence and absence of a malfunction based on a component of extracted at least one specific frequency f1 to f4.

Although there are various specific methods (determination conditions) of determining the presence and absence of the malfunction based on a component of at least one specific frequency f1 to f4, the determining processor 12 as one example determines the presence and absence of the malfunction by level comparison with a threshold. In this case, the determining processor 12 extracts a component of at least one specific frequency f1 to f4 from waveform data (armature-side data), thereby making it possible to determine "absence of malfunction" when the strength of the component is less than the threshold and determine "presence of malfunction" when it is equal to or greater than the threshold.

Here, the determining processor 12 may be configured to, when determining the "presence of malfunction", evaluate a malfunction level (degree of malfunction). For example, by evaluating the malfunction level in steps 99 of "1" to "99", the determining processor 12 is able to distinguish between a minor malfunction and a major malfunction. The malfunction level is determined according to, for example a difference value between intensity of a component of at least one specific frequency f1 to f4 and the threshold.

Other examples of the specific determination method for the determining processor 12 include a Mahalanobis-Taguchi Method, and machine learning algorithms such as k-Nearest Neighbor Algorithm, Support Vector Machine (SVM) and Neural Network. The "Neural Network" stated herein includes Deep Learning. However, the specific determination methods recited here are merely examples, and the specific determination methods may be appropriately changed.

The determining processor 12 may determine the presence and absence of the malfunction based on a component of at least one specific frequency f1 to f4, and may therefore perform the determination based on a component of only one specific frequency f1 or respective components of two or more specific frequencies f1 to f4. In the example of FIG. 3B, it is further assumed that four specific frequencies f1 to f4 in total with the reference frequency fs1 centered include two specific frequencies at a high frequency side and two other frequencies at a low frequency side. However, one or more specific frequencies may be at either side of a higher frequency or a lower frequency than the reference frequency fs1. Furthermore, five or more specific frequencies may be employed.

As stated above, since each of the specific frequencies f1 to f4 in the frequency spectrum has a local maximum in theory, local maxima points occur at specific intervals Fi1 with the reference frequency fs1 centered. However, the local maxima points in the frequency spectrum may occur at respective frequencies deviated from the specific frequencies f1 to f4 due to the influence of measurement error and the like of the measuring device 2. That is, an interval between local maximum points in the frequency spectrum may disagree with the specific interval Fi1. In this case, instead of one or more frequencies defined based on the specific interval Fi1 with the reference frequency fs1 centered, one or more frequencies each of which actually has a local maximum point in the frequency spectrum may be employed as one or more specific frequencies f1 to f4. For example, when a maximum point occurs in the vicinity of the frequency specified by "fs1+Fi1" (for example, a frequency slightly shifted to a high frequency side), a frequency that is in the vicinity of the frequency specified by "fs1+Fi1" and has a local maximum point may be employed as the specific frequency f1. Similarly, frequencies that are in the vicinity of frequencies specified by the specific intervals Fi1 with the reference frequency fs1 centered and actually have local maxima points in the frequency spectrum may be employed as the specific frequencies f2 to f4.

(2.5) Rotational Speed Estimating Algorithm

An operation of the estimating processor 15 for estimating the rotational speed of the rotor 442, namely a rotational speed estimating algorithm for the estimating processor 15 will be next explained in detail.

The present inventors have obtained knowledge that in the power generation equipment 4 that maintains the power generation frequency at a constant frequency (reference frequency fs1) by "slip frequency control" for supplying AC power (slip frequency power) to the field windings 452, information on the slip frequency is contained in an output of the field windings 452. The rotational speed estimating algorithm for the estimating processor 15 is based on the knowledge. That is, the estimating processor 15 estimates the rotational speed of the rotor 442 from waveform data (field-side data) that are included in pieces of waveform data acquired through the receiver 11 and represent the waveform of output currents of the field windings 452.

Specifically, the estimating processor 15 applies the fast Fourier transform to the field-side data, thereby calculating a frequency spectrum of the output currents of the field windings 452. The estimating processor 15 then analyzes the frequency spectrum to extract a slip frequency. The estimating processor 15 calculates the rotational speed of the rotor 442 according to the slip frequency fc1 obtained from the frequency spectrum of the output currents of the field windings 452. The reference frequency fs1 is expressed by the following Expression 1 where the rotational speed of the rotor 442 is Ra [rpm], the number of poles of the generator 44 is P1, the slip frequency is fc1 [Hz], and the slip frequency fc1 in Expression 1 is an absolute value.

$$fs1 = \frac{Ra}{60} \cdot \frac{P1}{2} \pm fc1 \qquad \text{(Expression 1)}$$

Here, since the number of poles P1 (e.g., "P1=4") of the generator 44 and the reference frequency fs1 are known, the slip frequency fc1 is obtained and thereby the rotational speed of the rotor 442, Ra, can be calculated from Expression 1. Thus, the estimating processor 15 enables estimation of the rotational speed of the rotor 442, Ra.

Figure 5:
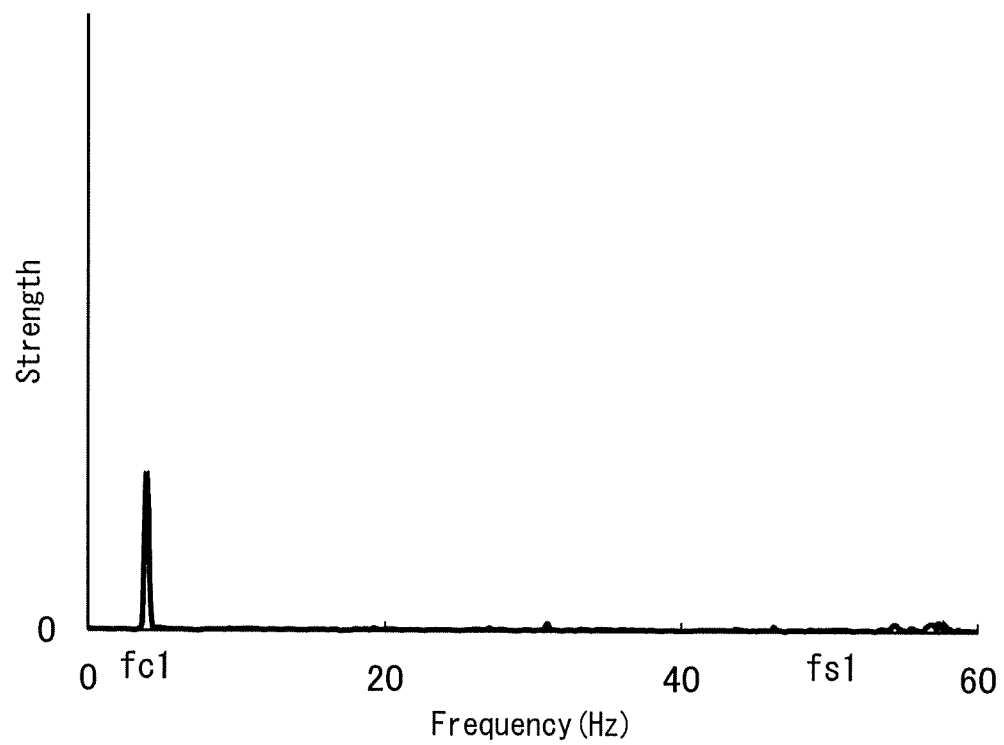
FIG. 5 shows a frequency spectrum of output currents through field windings.

As an example, it is assumed that the estimating processor 15 applies the fast Fourier transform to the field-side data, thereby calculating a frequency spectrum as illustrated in FIG. 5. In FIG. 5, a horizontal axis represents frequency [Hz] and a vertical axis represents strength (component size). As apparent from FIG. 5, the frequency spectrum of output currents of the field windings 452 has a maximum at the slip frequency fc1. That is, as shown in FIG. 5, the maximum point occurs at the slip frequency fc1 in the frequency spectrum. In the example of FIG. 5, the slip frequency fc1 is 3.875 [Hz]. In this case, assuming that the number of poles of the generator 44, P1, is "4" and the reference frequency fs1 is 50 [Hz], the rotational speed of the rotor 442, Ra, calculated by Expression 1 is 1616.25 [rpm].

In order to accurately calculate the rotational speed of the rotor 442, Ra, the estimating processor 15 needs to specify the sign (+/−) of a second term on the right side of Expression 1, namely the term of slip frequency fc1. The estimating processor 15 therefore estimates the rotational speed of the rotor 442 based on not only the field-side data but also the waveform data representing the waveform of output currents of the armature windings 451 (armature-side data). Specifically, the estimating processor 15 applies the fast Fourier transform to the armature-side data, thereby calculating a frequency spectrum of output currents of the armature windings 451. The estimating processor 15 then analyzes the frequency spectrum to extract strength (hereinafter referred to as a "peak level") of a component of the reference frequency fs1.

The estimating processor 15 determines a sign of the second term in the right side of Expression 1 according to the magnitude of the extracted peak level. When the rotational speed of the rotor 442, Ra, increases, an output of the power generation equipment 4 increases, so that the peak level increases. Therefore, when the peak level is equal to or greater than a predetermined value, the estimating processor 15 therefore determines that the rotational speed of the rotor 442, Ra, is equal to or greater than a synchronous speed, and then selects "−" as the sign. When the peak level is less than the predetermined value, the estimating processor 15 determines that the rotational speed of the rotor 442, Ra, is less than the synchronous speed, and then selects "+" as the sign. Here, the predetermined value to be compared with the peak level is determined based on statistical data.

The estimation processing of the rotational speed Ra as stated above is executed prior to determination of presence and absence of a malfunction by the determining processor 12. In short, when the determining processor 12 periodically determines the presence and absence of the malfunction, series of processes are performed. That is, the estimating processor 15 calculates the rotational speed Ra per determination, and the determining processor 12 determines the presence and absence of the malfunction. Note that applying the fast Fourier transform to the armature-side data is not indispensable for the estimating processor 15 because the determining processor 12 also applies the fast Fourier transform to the armature-side data. For example, the determining processor 12 and the estimating processor 15 may share a result (frequency spectrum) of application of the fast Fourier transform to the armature-side data.

The estimating processor 15 may estimate the rotational speed of the rotor 442 based only on the waveform data (armature-side data) representing the waveform of output currents of the armature windings 451 although this configuration is inferior to the abovementioned rotational speed estimating algorithm in estimation accuracy. For example, the estimating processor 15 may analyze a frequency spectrum of the output currents of the armature windings 451 and estimate the rotational speed of the rotor 442 from strength (peak level) of a component of the reference frequency fs1. That is, it is possible to estimate the rotational speed from the peak level when a correspondence relationship between the peak level and the rotational speed is known because the peak level increases as the rotational speed of the rotor 442 increases, as stated above.

(2.6) Application Example of Power Generation Equipment Monitoring System (2.6.1) Configuration A specific application example of the abovementioned power generation equipment monitoring system 1 will be next explained with reference to FIG. 6.

Figure 6:
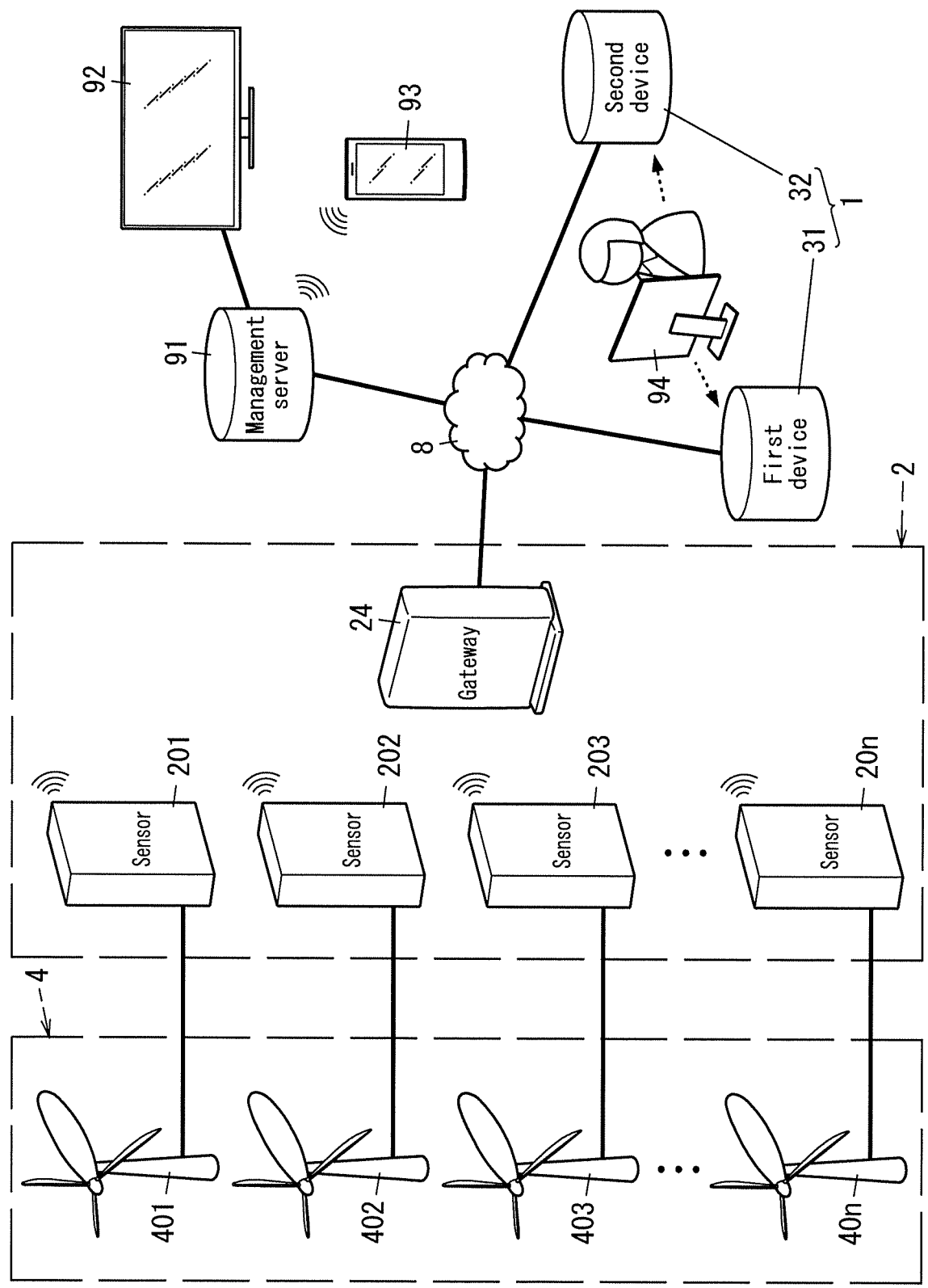
FIG. 6 is a schematic diagram of an application example of the power generation equipment monitoring system in accordance with Embodiment 1.

In the example of FIG. 6, the power generation equipment monitoring system 1 includes a first device 31 and a second device 32 that perform mutual data transmission. The receiver 11, the determining processor 12, the output device 13, the storage 14 and the estimating processor 15 constituting the determination device 10 are provided in the first and second devices 31 and 32 in a distributed manner. Herein, the first device 31 is provided with at least the storage 14, while the second device 32 is provided with the determining processor 12. The first device 31 is provided with the receiver 11 and the output device 13 besides the storage 14. The second device 32 is provided with the estimating processor 15 besides the determining processor 12.

In this example, the first device 31 constituting part of functions of the power generation equipment monitoring system 1 (determination device 10) fulfills a function of storing waveform data and a function of outputting (presenting, notifying) a determination result. The first device 31 further fulfills a function of managing user identifications (IDs) for user identification and log data. On the other hand, the second device 32 constituting other part of the functions of the power generation equipment monitoring system 1 (determination device 10) fulfills a function of analyzing waveform data, a function of determining presence and absence of a malfunction in the rotary block 41, and a function of estimating the rotational speed of the rotor 442. In short, the functions of the power generation equipment monitoring system 1 are distributed and installed on the first and second devices 31 and 32. The first and second devices 31 and 32 work together, thereby realizing the power generation equipment monitoring system 1.

In the present embodiment, each of the first and second devices 31 and 32 is realized by a cloud (cloud computing). Specifically, the first device 31 is a public cloud set up and constructed in the state of "A", while the second device 32 is a private cloud set up and constructed in the state of "B". That is, the determination device 10 is realized by a so-called hybrid cloud that is a combination of a public cloud and a private cloud. The state of "A" stated herein is a country in which the power generation equipment 4 is installed, and to which the user belongs. On the other hand, the state of "B" is a country different from the state of "A". In short, the first and second devices 31 and 32 are installed in different countries, and allowed to communicate with each other via the network 8 such as the Internet. Note that since the first device 31 includes the storage 14, a cloud having a larger storage capacity than the second device 32 is used for the first device 31.

Unencrypted (i.e., plaintext) data communication is performed between the first device 31 and the measuring device 2. Similarly, plaintext communication is also performed between the first device 31 and the second device 32. This makes it possible to operate the first device 31 even in a country or area where laws and regulations mandate the use of plaintext. This therefore enables the operation of the first device 31 even if the use of plaintext is mandated in, for example the state of "A". Note that the first device 31 is not limited to this, but may perform encrypted data communication in a country or area where such encrypted data communication is permitted.

In the example of FIG. 6, the power generation equipment 4 possesses wind turbine generators 401, 402, 403, . . . and 40n. Each of the wind turbine generators 401, 402, 403, . . . and 40n possesses a generator 44 including a stator 441 and a rotor 442 like the power generation equipment 4 explained in "(2.1) Power generation equipment". In short, the power generation equipment 4 in the example of FIG. 6 possesses generators 44 each of which converts energy of a corresponding rotor 442 into electric energy.

The wind turbine generators 401, 402, 403, . . . and 40n form a "power generator group". The wind turbine generators 401, 402, 403, . . . and 40n forming the "power generation equipment group" are installed at intervals of, for example several tens [m] to several [km].

The measuring device 2 possesses sensors 201, 202, 203, . . . and 20n. Each of the sensors 201, 202, 203, . . . and 20n corresponds to a combination of first and second sensors 211 and 212 as explained in the "(2.3.1) Measuring device". In short, each of the sensors 201, 202, 203, . . . and 20n detects respective currents flowing through corresponding armature-side electric conductors 541 and field-side electric conductors 542.

The sensors 201, 202, 203, . . . and 20n correspond one-to-one to the wind turbine generators 401, 402, 403, . . . and 40n, and in this state they are provided. In other words, the sensors 201, 202, 203, . . . and 20n correspond one-to-one to respective generators 44 (of the wind turbine generators 401, 402, 403, . . . and 40n) (see FIG. 1), and in this state they are provided. In short, the sensors 201, 202, 203, . . . and 20n are attached to armature-side electric conductors 541 and field-side electric conductors 542 in the wind turbine generators 401, 402, 403, . . . and 40n, respectively. The sensors 201, 202, 203, . . . and 20n form a "sensor group". Although FIG. 6 illustrates that the sensors 201, 202, 203, . . . and 20n are connected to the wind turbine generators 401, 402, 403, . . . and 40n, this is merely a schematic representation of correspondence between them. Actually, the sensors 201, 202, 203, . . . and 20n are installed in the wind turbine generators 401, 402, 403, . . . and 40n.

Each of the sensors 201, 202, 203, . . . and 20n is connected with a first communication unit 22 (see FIG. 2). The gateway 24 is connected with one second communication unit 23 (see FIG. 2). This enables many-to-one communication between the "sensor group" of the sensors 201, 202, 203, . . . and 20n, and the gateway 24.

Respective output current waveform data sets of the wind turbine generators 401, 402, 403, . . . and 40n are transmitted from respective first communication units 22 to the second communication unit 23, and then aggregated through the gateway 24. Thus, in the measuring device 2, respective waveform data measured with the wind turbine generators 401, 402, 403, . . . and 40n are collected by one gateway 24.

Here, respective identifiers provided for specifying the wind turbine generators 401, 402, 403, . . . and 40n in advance are assigned individually to the sensors 201, 202, 203, . . . and 20n. Moreover, respective management business owners' user IDs are assigned to the wind turbine generators 401, 402, 403, . . . and 40n in addition to the respective identifiers. This enables the power generation equipment monitoring system 1 to present information to each user based on a corresponding user ID. Here, the information represents presence and absence of a malfunction in one or more generators operated and managed by the user of the wind turbine generators 401, 402, 403, . . . and 40n.

Here, the power generation equipment monitoring system 1 (first and second devices 31 and 32) is configured to determine presence and absence of a malfunction in each of the generators 44 based on output currents detected with each of corresponding sensors of the sensors 201, 202, 203, . . . and 20n. That is, the present embodiment enables the power generation equipment monitoring system 1 to individually determine presence and absence of a malfunction in the rotary block 41 of each of the wind turbine generators 401, 402, 403, . . . and 40n. In this case, in addition to at least presence and absence of a malfunction in each rotary block 41, the output device 13 outputs, as a corresponding determination result, information (identifier) for specifying one or more wind turbine generators, as a determination target, of the wind turbine generators 401, 402, 403, . . . and 40n.

In the example of FIG. 6, a monitor 92 and a portable terminal 93 that are connectable to the management server 91 are provided. The monitor 92 and the portable terminal 93 are under user control, and function as a user interface of the management server 91 as a result of bring connected to the management server 91. The management server 91 therefore receives a determination result by the determination device 10, and then displays the determination result on the monitor 92 or the portable terminal 93, thereby enabling the presentation of the determination result to the user. Here, the monitor 92 and the portable terminal 93 may display not only the determination result by the determination device 10 but also waveform data stored in the storage 14 and the like. The portable terminal 93 is an information terminal configured to communicate with the management server 91, and examples thereof include a smartphone, a tablet terminator and the like.

In the example of FIG. 6, a maintenance terminal 94 for maintenance and management of the power generation equipment monitoring system 1 (first and second devices 31 and 32). The maintenance terminal 94 is configured to communicate with each of the first and second devices 31 and 32. The maintenance terminal 94 may be connected to the first and second devices 31 and 32 via the network 8 or via a dedicated circuit. The maintenance terminal 94 is managed by an administrator who operates the power generation equipment monitoring system 1, and communicates with the first device 31 or the second device 32 to change various settings of the power generation equipment monitoring system 1 or register or change users (user IDs). The maintenance terminal 94 also possesses a function of checking an operation state of the power generation equipment monitoring system 1, such as a determination result of the power generation equipment monitoring system 1.

(2.6.2) Operation

Figure 7:
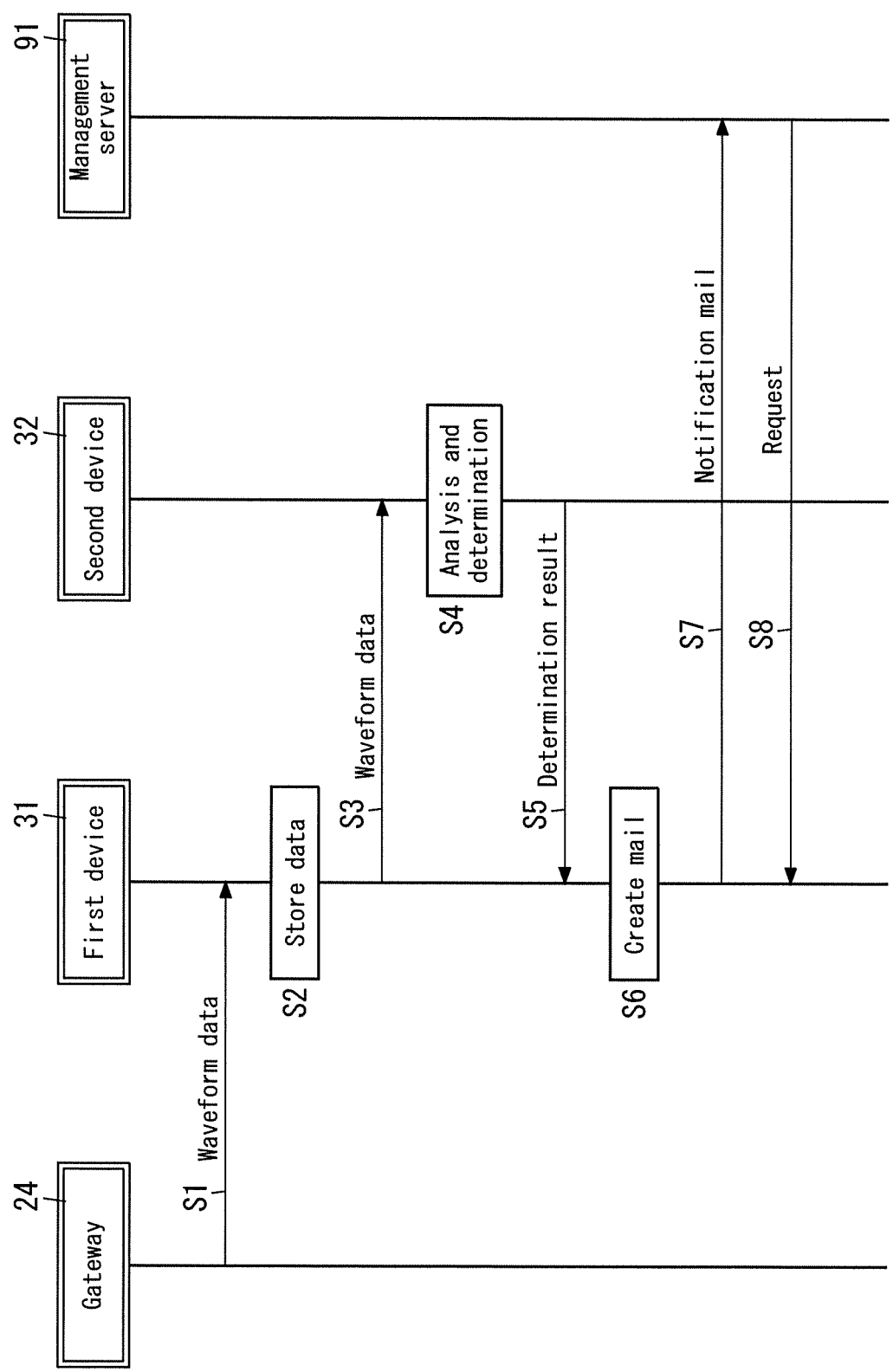
FIG. 7 is a sequence chart of an operation of the power generation equipment monitoring system as the application example shown in FIG. 6.

An operation of the power generation equipment monitoring system 1 configured as shown in FIG. 6 will be next explained with reference to FIG. 7.

The measuring device 2 periodically measures respective current waveform to transmit respective waveform data representing the respective current waveform from the gateway 24 to the first device 31 of the power generation equipment monitoring system 1 via the network 8 (S1). At this moment, the measuring device 2 transmits respective pieces of waveform data of currents measured by the sensors 201, 202, 203, . . . and 20n to the first device 31 while causing the gateway 24 to buffer the respective pieces of waveform data. Corresponding supplemental data are added to each waveform data where the corresponding supplemental data are information (identifier) for specifying one or more wind turbine generators as a measurement target of the wind turbine generators 401, 402, 403, . . . and 40n.

When receiving pieces of waveform data from the gateway 24, the first device 31 causes the storage 14 to store the pieces of waveform data (S2). At this moment, the first device 31 stores the pieces of waveform data in time series for each of the wind turbine generators 401, 402, 403, . . . and 40n. The pieces of waveform data stored in the first device 31 are not automatically deleted, but remain in the storage 14 until a predetermined operation is performed through the maintenance terminal 94. The first device 31 also transmits the pieces of waveform data to the second device 32 via the network 8 (S3).

When the second device 32 receives the pieces of waveform data from the first device 31, the determining processor 12 analyzes the pieces of waveform data to determine presence and absence of a malfunction in each rotary block 41 (S4). At this moment, the second device 32 causes a storage thereof to temporarily store the pieces of waveform data and analysis data acquired by analyzing the pieces of waveform data and basically automatically delete the pieces of waveform data and the analysis data in the storage when a determination result is acquired. The second device 32 transmits the determination result to the first device 31 via the network 8 (S4).

When receiving the determination result from the second device 32, the first device 31 creates an electronic mail for output of the determination result (S6). Here, the first device 31 functions as a Web server that provides a Web page showing the determination result. The electronic mail accordingly contains a Uniform Resource Locator (URL) of the Web page showing the determination result on the Internet. The first device 31 transmits the created electronic mail as a notification mail to the management server 91 via the network 8 (S7).

When receiving the notification mail, the management server 91 transfers the notification mail to the monitor 92 or the portable terminal 93. This enables a user to operate the monitor 92 or the portable terminal 93 to access the Web page showing the determination result based on the URL in the notification mail. When the user accesses the URL, the management server 91 transmits a request to the first device 31 (S8). As a result, the determination result on the Web page can be viewed by a Web browser function of the monitor 92 or the portable terminal 93. In short, the management server 91 functions as a Proxy server that is between the network 8 and the monitor 92 or the portable terminal 93, and performs Web access control.

(3) Schema

As stated above, a power generation equipment monitoring system 1 in accordance with a first aspect includes a receiver 11 and a determining processor 12. The receiver 11 is configured to acquire, from a measuring device 2 configured to measure output currents of a power generation equipment 4, waveform data representing waveform of the output currents. The power generation equipment 4 is configured to convert rotational energy of a rotor 442 thereof into electric energy to output AC voltage with a reference frequency. The determining processor 12 is configured to determine presence and absence of a malfunction in a rotary block 41 according to the waveform data acquired through the receiver 11. The rotary block 41 is configured to apply motive power to the rotor 442 of the power generation equipment 4. The determining processor 12 is configured to determine the presence and absence of the malfunction based on a component of at least one specific frequency arranged at one or more intervals according to a rotational speed of the rotor 442 from the reference frequency on a frequency axis in a frequency spectrum of the output currents.

With this aspect, the waveform data representing the waveform of the output currents of the power generation equipment 4 are monitored and the presence and absence of the malfunction in the rotary block 41 are determined from a symptom of the malfunction appearing in the waveform data. This accordingly enables a user to, when the power generation equipment monitoring system 1 determines the presence of the malfunction in the rotary block 41, take countermeasures such as maintenance (including inspection and repair) of the power generation equipment 4 before occurrence of serious damage to the power generation equipment 4. That is, this power generation equipment monitoring system 1 enables the user to recognize the symptom of damage to the power generation equipment 4 and take appropriate countermeasures before occurrence of serious damage to the power generation equipment 4, thereby hindering the progress of damage. In other words, the power generation equipment monitoring system 1 provides a prediction of damage to the power generation equipment 4, thereby enabling the user to systematically perform maintenance and management of the power generation equipment 4. It is consequently possible to avoid shutdown of the power generation equipment 4 due to the serious damage to the power generation equipment 4 and contribute to an improvement in the operation rate of the power generation equipment 4.

Moreover, with this power generation equipment monitoring system 1, it is possible to determine presence and absence of a malfunction in the rotary block 41 without detecting mechanical vibration occurring in the power generation equipment 4. That is, in the power generation equipment monitoring system 1 in accordance with the present embodiment, presence and absence of a malfunction in the rotary block 41 is able to be determined based on the waveform data presenting the waveform of the output currents of the power generation equipment 4. Specifically, the determining processor 12 determines the presence and absence of the malfunction based on a component of at least one specific frequency in the frequency spectrum of the output currents. The power generation equipment monitoring system 1 in accordance with the first aspect therefore requires that a sensor (first sensor 211) for measuring the current waveform is installed on output conductors (armature-side electric conductors 541) of the power generation equipment 4. According to the configuration of the first aspect, introduction of the power generation equipment monitoring system 1 becomes easy without installing the measuring device 2 in the vicinity of the occurrence location of vibration, unlike the abovementioned related vibration sensor.

In a power generation equipment monitoring system 1 in accordance with a second aspect according to the first aspect, the determining processor 12 is preferably configured to determine the presence and absence of the malfunction based on respective components of two or more specific frequencies. This aspect enables the determining processor 12 to perform determination by more various methods than determination by only the component of one specific frequency, thereby improving the determination accuracy of the presence and absence of the malfunction. Note that the determining processor 12 determining the presence and absence of the malfunction based on the respective components of two or more specific frequencies is not essential for the power generation equipment monitoring system 1. The determining processor 12 may perform the determination based on only the component of one specific frequency.

In a power generation equipment monitoring system 1 in accordance with a third aspect according to the first aspect or the second aspect, the power generation equipment 4 includes a stator 441 with armature windings 451, and is configured to generate AC voltage according to rotation of the rotor 442 relative to the stator 441. In this case, the measuring device 2 is preferably configured to measure, as the output currents, an output of the armature windings 451. This aspect enables the determining processor 12 to determine the presence and absence of the malfunction according to the output of the armature windings 451 in which a variation due to the malfunction in the rotary block 41 appears conspicuously, thereby improving the determination accuracy of the presence and absence of the malfunction. Note that the determining processor 12 determining the presence and absence of the malfunction according to the output of the armature windings 451 is not essential for the power generation equipment monitoring system 1. The determining processor 12 may determine the presence and absence of the malfunction according to an output of field windings 452.

In a power generation equipment monitoring system 1 in accordance with a fourth aspect according to the third aspect, the rotor 442 possesses field windings 452. In this case, the power generation equipment monitoring system 1 preferably further includes an estimating processor 15 configured to calculate the rotational speed of the rotor 442 according to at least an output of the field windings 452. This aspect enables the estimating processor 15 to estimate the rotational speed of the rotor 442 even when a rotational speed monitor to be attached to the power generation equipment 4 is not provided. In addition, the determining processor 12 is able to find a specific interval from the rotational speed of the rotor 442 estimated with the estimating processor 15 to specify a corresponding specific frequency according to the specific interval. This therefore enables the determining processor 12 to determine the presence and absence of the malfunction even without the rotational speed monitor. Note that the estimating processor 15 is not essential for the power generation equipment monitoring system 1. The estimating processor 15 may be omitted.

In a power generation equipment monitoring system 1 in accordance with a fifth aspect according to the fourth aspect, the estimating processor 15 is preferably configured to calculate the rotational speed of the rotor 442 according to the output of the armature windings 451 in addition to the output of the field windings 452. This aspect enables the estimating processor 15 to specify a sign of a slip frequency as explained in the "Rotational speed estimating algorithm" and improve the estimation accuracy of the rotational speed of the rotor 442. Note that the estimating processor 15 estimating the rotational speed of the rotor 442 according to the output of the armature windings 451 is not essential for the power generation equipment monitoring system 1. The estimating processor 15 may calculate the rotational speed of the rotor 442 from only the output of the field windings 452.

(4) Modified Examples

The power generation equipment monitoring systems 1 described above are merely examples of the present invention. The present invention is not limited to Embodiment 1, but various modifications are possible in light of general arrangement and the like and may be made regardless of Embodiment 1 without departing from the scope of technical ideas according to the present invention.

A monitored target of the power generation equipment monitoring system 1 may be power generation equipment 4 described below. That is, the power generation equipment 4 as the monitored target may include the field windings 452 that are included in the rotor 442 and electrically connected to the power supply conductors 52 via the power converter 51, and be configured to convert the rotational energy of the rotor 442 to electric energy to provide the electric energy to the power supply conductors 52. Therefore, the monitored target is not limited to the wind turbine generator equipment, but examples of the monitored target of the power generation equipment monitoring system 1 may include hydroelectric power equipment, thermal power equipment, nuclear power equipment, geothermal power equipment, pumped storage power equipment and wave activated power equipment. In the case of the power generation equipment 4 other than the Doubly Fed Induction Generator, in the case of, for example a synchronous generator, the reference frequency of the AC voltage output from the power generation equipment 4 fluctuates according to the rotational speed of the rotary body 410. That is, the reference frequency of the AC voltage output from the power generation equipment 4 may vary and not be constant.

The information on the rotational speed of the rotor 442 obtained from the estimating processor 15 is not limited to the determination of the presence and absence of the malfunction by the determining processor 12, but may be used for other purposes. In this case, as long as the power generation equipment monitoring system 1 includes at least the receiver 11 and the estimating processor 15, the determining processor 12 may be omitted. In the case where the information on the rotational speed is used for purposes other than the determination of the presence and absence of the malfunction by the determining processor 12, the output device 13 may transmit the information on the rotational speed of the rotor 442 estimated with the estimating processor 15 to the management server 91 via the network 8, for example. This enables the management server 91 to present the rotational speed of the rotor 442 to a user.

Each of the first and second devices 31 and 32 is not limited to a cloud (cloud computing), but may be realized by, for example a computer such as a server. Further, as long as the power generation equipment monitoring system 1 includes the first and second devices 31 and 32, the functions of the power generation equipment monitoring system 1 may be distributed to three or more devices. Furthermore, the power generation equipment monitoring system 1 is not limited to the configuration including the first and second devices 31 and 32, but the functions of the power generation equipment monitoring system 1 may be realized by one device. In addition, the first and second devices 31 and 32 may be installed in the same country.

The assignment of the functions of the power generation equipment monitoring system 1 to the first and second devices 31 and 32 is not limited to the abovementioned example, but the output device 13 may be provided for not the first device 31 but the second device 32. In this case, the determination result by the determining processor 12 is provided from the output device 13 of the second device 32 without being returned to the first device 31.

The measuring device 2 is not limited to the configuration that periodically outputs the waveform data set, but may be configured to receive a measurement request from a user and output a waveform data set as a response to the measurement request to the determination device 10. In this case, for example, when the user performs a predetermined operation through the portable terminal 93, a measurement request is transmitted from the management server 91 to the measuring device 2, and the measuring device 2 transmits the waveform data set to determination device 10 according to the measurement request as a trigger.

The measuring device 2 is not limited to a configuration in which whether or not the power generation equipment 4 is in operation is determined according to a state signal output from the power generation equipment 4 but may be configured to perform the determination according to an output of the first sensor 211 or the second sensor 212.

The power generation equipment monitoring system 1 may be configured so that even sudden damage such as breakage of the rotary block 41 caused by a tornado is determined as a malfunction in the rotary block 41. In this case, it is preferable that the output device 13 distinguishes and presents the sudden damage and the aged deterioration occurring in the rotary block 41 while the power generation equipment 4 is normally driven, like the flaking of the bearing 412.

The first and second sensors 211 and 212 in the measuring device 2 are not limited to a configuration in which the first and second sensors 211 and 212 are installed in the tower 43 of the power generation equipment 4, but may be installed outside the tower 43.

(5) Power Generation Equipment Monitoring Method and Program

Adopting a power generation equipment monitoring method described below in order to monitor power generation equipment 4 enables the realization of the power generation equipment monitoring system 1 in accordance with Embodiment 1 (including modified examples) with no dedicated determination device 10. The power generation equipment 4 stated herein is configured to convert rotational energy of the rotor 442 into electric energy to output AC voltage with the reference frequency.

That is, the power generation equipment monitoring method includes a receiving step acquiring, from the measuring device configured to measure output currents of the power generation equipment 4, waveform data representing the output currents, and a determining step. The determining step includes determining presence and absence of a malfunction in the rotary block 41 according to the waveform data acquired by the receiving step. The rotary block 41 is configured to apply motive power to the rotor 442 of the power generation equipment 4. The determining step includes determining the presence and absence of the malfunction based on a component of at least one specific frequency arranged at one or more intervals according to the rotational speed of the rotor 442 from the reference frequency on the frequency axis in the frequency spectrum of the output currents. That is, the receiving step corresponds to a process performed by the receiver 11, while the determining step corresponds to a process performed by the determining processor 12 explained in the "(2.4) Determination algorithm".

This power generation equipment monitoring method enables the realization of the power generation equipment monitoring system 1 in accordance with Embodiment 1 (including modified examples) with no dedicated determination device 10, and facilitates the introduction of the power generation equipment monitoring system 1.

In the case where the power generation equipment monitoring system 1 includes a computer as a main component, a program stored in a memory of the computer causes the computer to function as the receiver 11 and the determining processor 12. The receiver 11 is configured to acquire, from the measuring device 2 configured to measure output currents of the power generation equipment 4, waveform data representing the output currents. The power generation equipment 4 is configured to convert rotational energy of the rotor 442 into electric energy to output AC voltage with the reference frequency. The determining processor 12 is configured to determine presence and absence of a malfunction in the rotary block 41 according to the waveform data acquired through the receiver 11. The rotary block 41 is configured to apply motive power to the rotor 442 of the power generation equipment 4. The determining processor 12 is configured to determine the presence and absence of the malfunction based on a component of at least one specific frequency arranged at one or more intervals according to the rotational speed of the rotor 442 from the reference frequency on the frequency axis in the frequency spectrum of the output currents.

This program enables the realization of the power generation equipment monitoring system 1 in accordance with Embodiment 1 (including modified examples) with no dedicated determination device 10, and facilitates the introduction of the power generation equipment monitoring system 1. The program may be stored in the memory of the computer in advance, but is not limited to the example. The program may be provided through a telecommunications network, or provided by being stored in a storage medium such as a memory card.

Various configurations described above, a configuration described in the following Embodiment 2 and an appropriate combination thereof may be applied to the power generation equipment monitoring system 1 in accordance with Embodiment 1 (including modified examples) realized by the power generation equipment monitoring method and the program. That is, for example, the determining step in the power generation equipment monitoring method may include determining the presence and absence of the malfunction based on respective components of two or more specific frequencies. In addition, the power generation equipment monitoring method may further include an estimating step calculating the rotational speed of the rotor 442 according to at least the output of the field windings 452. The estimating step corresponds to a process performed by the estimating processor 15 explained in the "(2.5) Rotational speed estimating algorithm". In addition, the estimating step may include calculating the rotational speed of the rotor 442 according to the output of the armature windings 451 in addition to the output of the field windings 452.

Embodiment 2

A power generation equipment monitoring system 1 in accordance with the present embodiment differs from the power generation equipment monitoring system 1 in accordance with Embodiment 1 in that a determining processor 12 is configured to determine presence and absence of a malfunction in a rotary block 41 regardless of the rotational speed of a rotor 442 estimated with an estimating processor 15. Hereinafter, the same reference signs are given to the same configurations as those of Embodiment 1, and the explanation is appropriately omitted.

In the present embodiment, the determining processor 12 acquires information on the rotational speed of the rotor 442 from a device other than the estimating processor 15, such as, for example a rotational speed monitor. The determining processor 12 then calculates a specific interval Fi1 from the rotational speed of the rotor 442 to specify one or more specific frequencies f1 to f4 according to the specific interval Fi1. The determining processor 12 extracts respective components of the one or more specific frequencies f1 to f4 from a frequency spectrum of output currents of power generation equipment 4 to determine the presence and absence of the malfunction based on a component of extracted at least one specific frequency f1 to f4.

As describe above, the power generation equipment 4 is provided with, for example the rotational speed monitor. This configuration enables the determining processor 12 to determine presence and absence of a malfunction in the rotary block 41 according to an output of the rotational speed monitor. In the power generation equipment monitoring system 1 in accordance with the present embodiment, the estimating processor 15 may therefore be omitted. Note that information on the rotational speed of the rotor 442 estimated with the estimating processor 15 may be used for purpose other than the determination of the presence or absence of a malfunction by the determining processor 12. The power generation equipment monitoring system 1 in accordance with the present embodiment may therefore include the estimating processor 15.

The configuration described in Embodiment 2 may be applied to appropriate combinations with the various structures described in Embodiment 1 (including modified examples).

REFERENCE SIGNS LIST

1 Power generation equipment monitoring system
11 Receiver
12 Determining processor
15 Estimating processor
2 Measuring device
4 Power generation equipment
41 Rotary block
441 Stator
442 Rotor
451 Armature winding
452 Field winding
fs1 Reference frequency
f1-f4 Specific frequency

The invention claimed is:

1. A power generation equipment monitoring system, comprising
a receiver configured to acquire, from a measuring device configured to measure output currents of power generation equipment, waveform data representing waveform of the output currents, the power generation equipment being configured to convert rotational energy of a rotor thereof into electric energy to output alternating current (AC) voltage with a reference frequency,
a determining processor configured to determine presence and absence of a malfunction in a rotary block according to the waveform data acquired through the receiver, the rotary block being configured to apply motive power of a rotary body to the rotor of the power generation equipment, the rotary body including a plurality of blades, and
an estimating processor configured to calculate a rotational speed of the rotor,
wherein the estimating processor is configured to estimate the rotational speed of the rotor based on data from the power generation equipment, the rotational speed of the rotor varying according to a wind speed, and
the determining processor being configured to determine the presence and absence of the malfunction based on a component of at least one specific frequency arranged at one or more intervals according to the rotational speed of the rotor estimated by the estimating processor from the reference frequency on a frequency axis in a frequency spectrum of the output currents.

2. The power generation equipment monitoring system of claim 1, wherein the determining processor is configured to determine the presence and absence of the malfunction based on respective components of two or more specific frequencies.

3. The power generation equipment monitoring system of claim 2, wherein
the power generation equipment comprises a stator with armature windings, and is configured to generate the AC voltage by rotation of the rotor relative to the stator, and
the measuring device is configured to measure, as the output currents, an output of the armature windings.

4. The power generation equipment monitoring system of claim 3, wherein
the rotor includes field windings, and
the power generation equipment monitoring system further comprises the estimating processor configured to calculate the rotational speed of the rotor according to at least an output of the field windings.

5. The power generation equipment monitoring system of claim 4, wherein the estimating processor is configured to calculate the rotational speed of the rotor according to the output of the armature windings in addition to the output of the field windings.

6. The power generation equipment monitoring system of claim 1, wherein
the power generation equipment comprises a stator with armature windings, and is configured to generate the AC voltage by rotation of the rotor relative to the stator, and
the measuring device is configured to measure, as the output currents, an output of the armature windings.

7. The power generation equipment monitoring system of claim 6, wherein
the rotor includes field windings, and
the power generation equipment monitoring system further comprises the estimating processor configured to calculate the rotational speed of the rotor according to at least an output of the field windings.

8. The power generation equipment monitoring system of claim 7, wherein the estimating processor is configured to calculate the rotational speed of the rotor according to the output of the armature windings in addition to the output of the field windings.

9. The power generation equipment monitoring system of claim 1, further comprising a storage configured to store a relationship between specific intervals and rotational speeds of the rotor,
the determining processor being configured to determine the presence and absence of the malfunction based on a component of at least one specific frequency arranged at a specific interval, the specific interval corresponding to the rotational speed of the rotor calculated by the estimating processor in the relationship stored in the storage.

10. A power generation equipment monitoring method, comprising
a receiving step acquiring, from a measuring device configured to measure output currents of power generation equipment, waveform data representing waveform of the output currents, the power generation equipment being configured to convert rotational energy of a rotor thereof into electric energy to output alternating current (AC) voltage with a reference frequency,
a determining step determining presence and absence of a malfunction in a rotary block according to the waveform data acquired through the receiving step, the rotary block being configured to apply motive power of a rotary body to the rotor of the power generation equipment, the rotary body including a plurality of blades, and an estimating step calculating a rotational speed of the rotor, wherein the estimating step estimates the rotational speed of the rotor based on data from the power generation equipment, the rotational speed of the rotor varying according to a wind speed, and the determining step including determining the presence and absence of the malfunction based on a component of at least one specific frequency arranged at one or more intervals according to the rotational speed of the rotor estimated by the estimating step from the reference frequency on a frequency axis in a frequency spectrum of the output currents.

11. The power generation equipment monitoring method of claim 10, wherein the determining step includes determining the presence and absence of the malfunction based on respective components of two or more specific frequencies.

12. The power generation equipment monitoring method of claim 11, wherein the power generation equipment comprises a stator with armature windings and is configured to generate the AC voltage according to rotation of the rotor relative to the stator, and the measuring device is configured to measure, as the output currents, an output of the armature windings.

13. The power generation equipment monitoring method of claim 12, wherein the rotor includes field windings, and the power generation equipment monitoring method further includes the estimating step calculating the rotational speed of the rotor according to at least an output of the field windings.

14. The power generation equipment monitoring method of claim 13, wherein the estimating step includes calculating the rotational speed of the rotor according to the output of the armature windings in addition to the output of the field windings.

15. The power generation equipment monitoring method of claim 10, wherein the power generation equipment comprises a stator with armature windings and is configured to generate the AC voltage according to rotation of the rotor relative to the stator, and the measuring device is configured to measure, as the output currents, an output of the armature windings.

16. The power generation equipment monitoring method of claim 15, wherein the rotor includes field windings, and the power generation equipment monitoring method further includes the estimating step calculating the rotational speed of the rotor according to at least an output of the field windings.

17. The power generation equipment monitoring method of claim 16, wherein the estimating step includes calculating the rotational speed of the rotor according to the output of the armature windings in addition to the output of the field windings.

18. The power generation equipment monitoring method of claim 10, wherein the determining step includes determining the presence and absence of the malfunction based on a component of at least one specific frequency arranged at a specific interval, the specific interval corresponding to the rotational speed of the rotor calculated by the estimating processor in a relationship stored in a storage, the relationship being between specific intervals and rotational speeds of the rotor.

19. A non-transitory computer-readable medium, comprising instructions stored thereon, that when executed on a computer, perform a receiving step acquiring, from a measuring device configured to measure output currents of power generation equipment, waveform data representing waveform of the output currents, the power generation equipment being configured to convert rotational energy of a rotor thereof into electric energy to output alternating current (AC) voltage with a reference frequency, a determining step determining presence and absence of a malfunction in a rotary block according to the waveform data acquired through the receiving step, the rotary block being configured to apply motive power of a rotary body to the rotor of the power generation equipment, the rotary body including a plurality of blades, and an estimating step calculating a rotational speed of the rotor, wherein the estimating step estimates the rotational speed of the rotor based on data from the power generation equipment, the rotational speed of the rotor varying according to a wind speed, and the determining step including determining the presence and absence of the malfunction based on a component of at least one specific frequency arranged at one or more intervals according to the rotational speed of the rotor estimated by the estimating step from the reference frequency on a frequency axis in a frequency spectrum of the output currents.

* * * * *